US012581799B2

(12) United States Patent
Kim et al.

(10) Patent No.: US 12,581,799 B2
(45) Date of Patent: Mar. 17, 2026

(54) LIGHT CONTROL MEMBER AND DISPLAY DEVICE INCLUDING THE SAME

(71) Applicant: Samsung Display Co., Ltd., Yongin-si (KR)

(72) Inventors: Jeongki Kim, Hwaseong-si (KR); Jang-Il Kim, Asan-si (KR); Jong-Hoon Kim, Seoul (KR); Kyounghae Min, Asan-si (KR); Hyejun Woo, Asan-si (KR); Seongyeon Lee, Asan-si (KR); Sujin Lee, Hwaseong-si (KR); Si-Wan Jeon, Hwaseong-si (KR); Tae Hyung Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 470 days.

(21) Appl. No.: 18/100,057

(22) Filed: Jan. 23, 2023

(65) Prior Publication Data

US 2023/0292545 A1 Sep. 14, 2023

(30) Foreign Application Priority Data

Mar. 8, 2022 (KR) ........................ 10-2022-0029435

(51) Int. Cl.
*H10K 50/858* (2023.01)
*H10K 50/86* (2023.01)
*H10K 102/00* (2023.01)
(52) U.S. Cl.
CPC ......... *H10K 50/858* (2023.02); *H10K 50/865* (2023.02); *H10K 2102/331* (2023.02)

(58) Field of Classification Search
None
See application file for complete search history.

(56) References Cited

U.S. PATENT DOCUMENTS

| | | | | |
|---|---|---|---|---|
| 11,041,981 B2 | 6/2021 | Jung et al. | | |
| 11,042,059 B2 | 6/2021 | Lee et al. | | |
| 2007/0146598 A1* | 6/2007 | Yokokawa | ............ | G02F 1/1337 349/123 |
| 2009/0078939 A1* | 3/2009 | Yamazaki | ............ | H10D 86/441 257/E33.001 |
| 2019/0121176 A1* | 4/2019 | Lee | ........................ | H10K 59/879 |
| 2020/0258946 A1* | 8/2020 | Kim | ........................ | H10K 59/38 |
| 2020/0326586 A1* | 10/2020 | Kim | ................. | G02F 1/133516 |
| 2021/0206142 A1* | 7/2021 | Gu | ......................... | G02B 1/115 |
| 2022/0365265 A1* | 11/2022 | Kubota | ................ | G02B 5/3033 |

FOREIGN PATENT DOCUMENTS

| | | |
|---|---|---|
| KR | 10-2019-0047592 | 5/2019 |
| KR | 10-2019-0063618 | 6/2019 |
| KR | 10-2020-0086413 | 7/2020 |
| KR | 10-2021-0082291 | 7/2021 |

* cited by examiner

*Primary Examiner* — Nduka E Ojeh
(74) *Attorney, Agent, or Firm* — CANTOR COLBURN LLP

(57) ABSTRACT

Embodiments provide a light control member that includes a light control layer including quantum dots, a low refractive layer disposed on the light control layer, and a capping layer disposed between the light control layer and the low refractive layer. The capping layer includes a first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %. Accordingly, the light control member exhibits excellent reliability.

30 Claims, 13 Drawing Sheets

LIGHT CONTROL MEMBER AND DISPLAY DEVICE INCLUDING THE SAME

CROSS-REFERENCE TO RELATED APPLICATION(S)

This application claims priority to and benefits of Korean Patent Application No. 10-2022-0029435 under 35 U.S.C. § 119, filed on Mar. 8, 2022 in the Korean Intellectual Property Office, the entire contents of which are incorporated herein by reference.

BACKGROUND

1. Technical Field

The disclosure herein relates to a light control member and a display device including the same, to a light control member including a low refractive layer, and to a display device including the light control member.

2. Description of the Related Art

Various display devices for providing image information in multimedia devices such as a television, a mobile phone, a tablet computer, a navigation system, and a game machine are being developed. In a display device including liquid crystal display elements, organic light emission display elements, and the like, quantum dots and the like may be introduced to improve display quality.

A low refractive layer may be introduced to allow display devices including quantum dots to exhibit improved reflectance properties. The low refractive layer may include hollow particles and the like, and due to hollow portions of the hollow particles, there is a seam at an interface with a component adjacent to the low refractive layer. As a result, the reliability of a display device may be degraded.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light control member in which a capping layer adjacent to a low refractive layer may have improved reliability, and a display device including the light control member.

An embodiment provides a light control member which may include a light control layer including a quantum dot, a low refractive layer disposed on the light control layer, and a capping layer disposed between the light control layer and the low refractive layer. The capping layer may include a first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %.

In an embodiment, a refractive index of the capping layer may be in a range of about 1.35 to about 1.60.

In an embodiment, a refractive index of the capping layer may be greater than a refractive index of the low refractive layer and equal to or less than a refractive index of the light control layer.

In an embodiment, the capping layer may have a ratio of oxygen atoms to silicon atoms in a range of about 1.0 to about 2.0.

In an embodiment, a thickness of the capping layer may be in a range of about 3,000 Å to less than about 8,000 Å.

In an embodiment, the light control member may further include a barrier layer disposed between the capping layer and the light control layer or between the capping layer and the low refractive layer, and a sub-capping layer disposed between the barrier layer and the light control layer or between the barrier layer and the low refractive layer, wherein a refractive index of the barrier layer may be greater than a refractive index of the capping layer and a refractive index of the sub-capping layer.

In an embodiment, the barrier layer may include silicon nitride or a second silicon oxynitride, and the second silicon oxynitride may have a higher ratio of nitrogen atoms than a ratio of oxygen atoms.

In an embodiment, the sub-capping layer may include silicon oxide or the first silicon oxynitride.

In an embodiment, the sub-capping layer may have a ratio of oxygen atoms to silicon atoms in a range of about 1.0 to about 2.0.

In an embodiment, a thickness of the barrier layer may be in a range of about 25% to about 74% of a total thickness of the capping layer, the barrier layer, and the sub-capping layer.

In an embodiment, a thickness of the barrier layer may be in a range of about 1,000 Å to about 5,920 Å.

In an embodiment, a refractive index of the barrier layer may be in a range of about 1.59 to about 1.89.

In an embodiment, a refractive index of the capping layer and the sub-capping layer may each independently be in a range of about 1.41 to about 1.49.

In an embodiment, a thickness of one of the capping layer and the sub-capping layer may be in a range of about 13% to about 38% of a total thickness of the capping layer, the barrier layer, and the sub-capping layer, and a thickness of the other of the capping layer and the sub-capping layer may be in a range of about 13% to about 62% of a total thickness of the capping layer, the barrier layer, and the sub-capping layer.

In an embodiment, a thickness of one of the capping layer and the sub-capping layer may be in a range of about 500 Å to about 3,040 Å, and a thickness of the other of the capping layer and the sub-capping layer may be in a range of about 500 Å to about 4,960 Å.

In an embodiment, a display device may include a lower panel including a display element layer which may include a first electrode, a second electrode facing the first electrode, and a light emission layer disposed between the first electrode and the second electrode; and an upper panel disposed on the lower panel and which may include a light control member, and a color filter layer disposed on the light control member. The light control member may include a light control layer including a quantum dot, a low refractive layer disposed on the light control layer, and a capping layer disposed between the low refractive layer and the light control layer. The capping layer may include a first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %.

In an embodiment, the capping layer may have a ratio of oxygen atoms to silicon atoms in a range of about 1.0 to about 2.0.

In an embodiment, a refractive index of the capping layer may be in a range of about 1.35 to about 1.60.

In an embodiment, the display device may further include a barrier layer disposed between the capping layer and the light control layer or between the capping layer and the low refractive layer, and a sub-capping layer disposed between the barrier layer and the light control layer or between the barrier layer and the low refractive layer, wherein the barrier layer may include silicon nitride or a second silicon oxynitride, and the second silicon oxynitride may have a higher ratio of nitrogen atoms than a ratio of oxygen atoms.

In an embodiment, the sub-capping layer may include silicon oxide or the first silicon oxynitride.

In an embodiment, a refractive index of the barrier layer may be greater than a refractive index of the capping layer and greater than a refractive index of the sub-capping layer.

In an embodiment, a refractive index of the barrier layer may be in a range of about 1.59 to about 1.89, and a refractive index of the capping layer and the sub-capping layer may each independently be in a range of about 1.41 to about 1.49.

In an embodiment, the low refractive layer and the light control layer may each contact the capping layer.

In an embodiment, the low refractive layer may include a plurality of hollow particles, and each of the hollow particles may include a hollow portion filled with air or filled with liquid.

In an embodiment, the light emission layer may emit a first light, and the light control layer may include a first light control part converting the first light into a second light, a second light control part converting the first light into a third light, and a third light control part transmitting the first light.

In an embodiment, a display device may include a lower panel which may include a display element layer which may include a first electrode, a second electrode facing the first electrode, and a light emission layer disposed between the first electrode and the second electrode; and an upper panel disposed on the lower panel and which may include a light control layer which may include a quantum dot, a low refractive layer disposed on the light control layer, and a capping layer disposed between the light control layer and the low refractive layer. The capping layer may include silicon oxynitride having a ratio of oxygen atoms to silicon atoms in a range of about 1.0 to about 2.0, and the ratio of the oxygen atoms may be higher than the ratio of nitrogen atoms.

In an embodiment, the capping layer may include an amount of nitrogen in a range of about 0.1 at % to about 18 at %, an amount of oxygen in a range of about 42 at % to about 70 at %, and an amount of silicon in a range of about 25 at % to about 45 at %.

In an embodiment, a refractive index of the capping layer may be in a range of about 1.35 to about 1.60.

It is to be understood that the embodiments above are described in a generic and explanatory sense only and not for the purpose of limitation, and the disclosure is not limited to the embodiments described above.

BRIEF DESCRIPTION OF THE DRAWINGS

The accompanying drawings are included to provide a further understanding of embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
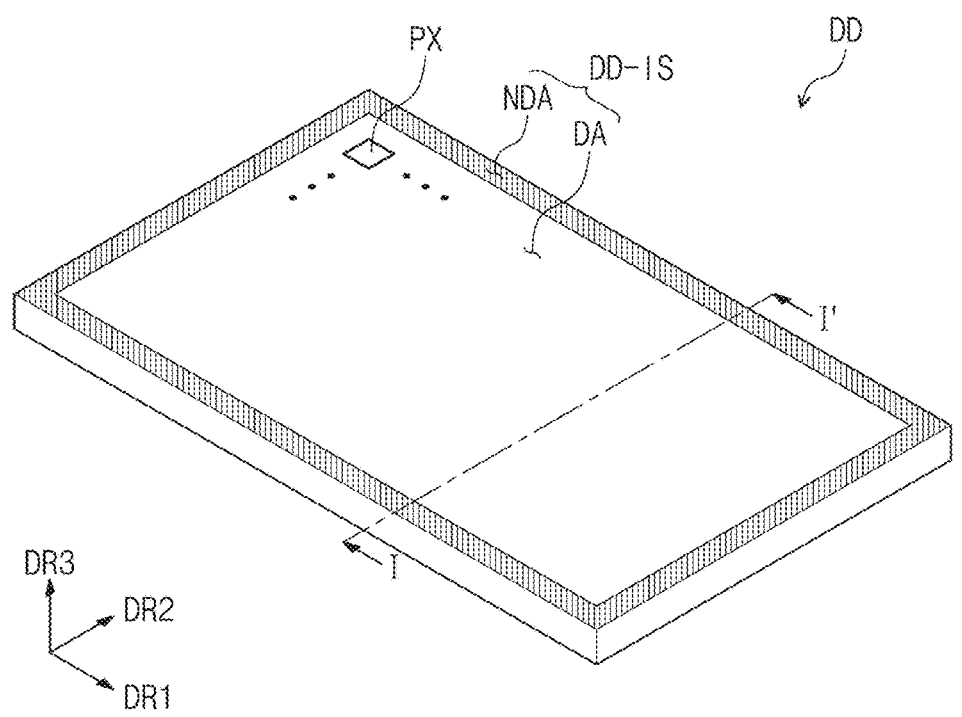
FIG. 1 is a schematic perspective view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, +10%, or +5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
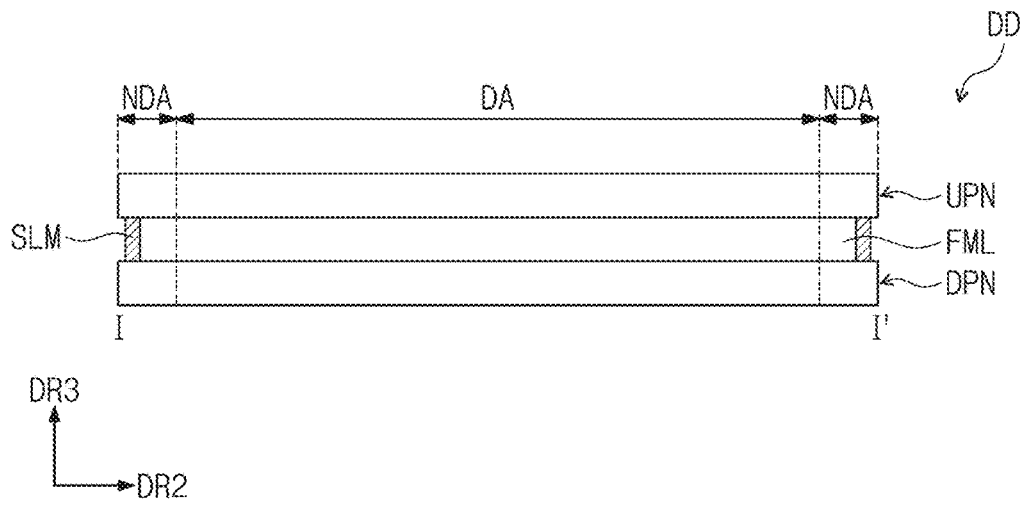
FIG. 2 is a schematic cross-sectional view showing a portion corresponding to line I-I' of FIG. 1.

Hereinafter, according to embodiments, a light control member and a display device including the light control member will be described with reference to the accompanying drawings. FIG. 1 is a schematic perspective view showing a display device of an embodiment of the inventive concept. FIG. 2 is a schematic cross-sectional view showing a portion corresponding to line I-I' of FIG. 1.

A display device DD of an embodiment may be a device activated according to an electrical signal. For example, the display device DD may be a television, an external billboard, a portable electronic apparatus, a tablet computer, a car navigation system unit, a game console, a personal computer, a laptop computer, or a wearable device, but is not limited thereto.

The thickness direction of the display device DD may be a direction parallel to a third direction axis DR3, which may be a normal direction with respect to a plane defined by the first direction axis DR1 and the second direction axis DR2. Directions indicated by the first to third direction axes DR1, DR2, and DR3 described in the specification may be a relative concept, and may be converted into different directions. The directions indicated by the first to third direction axes DR1, DR2, and DR3 may be described as first to third directions, and may be denoted by the same reference numerals. In the disclosure, a front surface (or an upper surface) and a rear surface (or a lower surface) of members constituting the display device DD may be defined on the basis of the third direction axis DR3. In the disclosure, an upper portion and a lower portion may be based on the third direction axis DR3, and a direction relatively adjacent to a display surface DD-IS may indicate the upper portion, and a direction relatively spaced apart from the display surface DD-IS may indicate the lower portion.

The display device DD may display an image (or a video) through the display surface DD-IS. The display surface DD-IS may be parallel to a plane defined by the first direction axis DR1 and the second direction axis DR2. The display surface DD-IS may include a display region DA and a non-display region NDA.

A pixel PX may be disposed in the display region DA, and the pixel PX may not be disposed in the non-display region NDA. The non-display region NDA may be defined along the edge of the display surface DD-IS. The non-display region NDA may surround the display region DA. However, the embodiments are not limited thereto, and the non-display region NDA may be omitted, or the non-display region NDA may be disposed on only one side of the display region DA.

FIG. 1 illustrates the display device DD provided with a planar display surface DD-IS, but the embodiments are not limited thereto. The display device DD may include a curved display surface or a three-dimensional display surface. The three-dimensional display surface may include display regions indicating different directions.

Referring to FIG. 2, the display device DD may include a lower panel DPN and an upper panel UPN disposed on the lower panel DPN. The display device DD may include a filling layer FML and an encapsulation portion SLM which may be disposed between the lower panel DPN and the upper panel UPN.

The encapsulation portion SLM may couple the lower panel DPN and the upper panel UPN. The encapsulation portion SLM may be disposed in the non-display region NDA and couple the lower panel DPN and the upper panel UPN. The encapsulation portion SLM may be disposed in the non-display region NDA, which may be an outer periphery portion of the display device DD, and may prevent foreign substances, oxygen, moisture, and the like from entering the display device DD from the outside. The encapsulation portion SLM may be formed from a sealant including a curable resin. The sealant may include an epoxy-based resin or an acrylic resin. The sealant may be a thermosetting material or a photocurable material. The sealant may be provided on one surface of the lower panel DPN or the upper panel UPN. Thereafter, the lower panel DPN and the upper panel may be bonded so as to face each other, and the sealant may be cured by being provided with heat or ultraviolet light, and as a result, the encapsulation portion SLM may be formed.

The filling layer FML may fill between the lower panel DPN and the upper panel UPN in the display region DA and the non-display region NDA. The filling layer FML may function as a buffer. The filling layer FML may perform impact absorption and the like, and may increase the strength of the display device DD. The filling layer FML may be formed from a filling resin which includes a polymer resin. For example, the filling layer FML may be formed from a filling layer resin which includes an acrylic resin, an epoxy-based resin, or the like. Unlike what is illustrated, the filling layer FML and the encapsulation portion SLM may be omitted.

Figure 3:
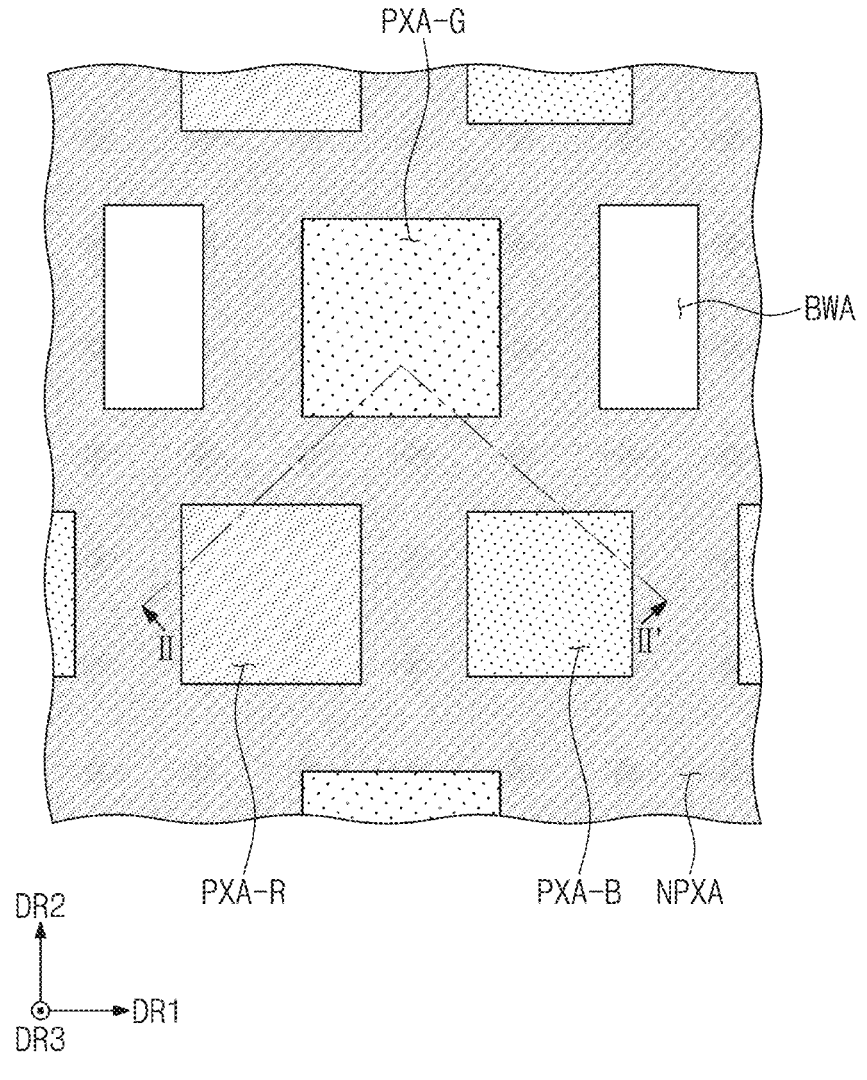
FIG. 3 is a schematic plan view showing a portion of a display device according to an embodiment.
Figure 4:
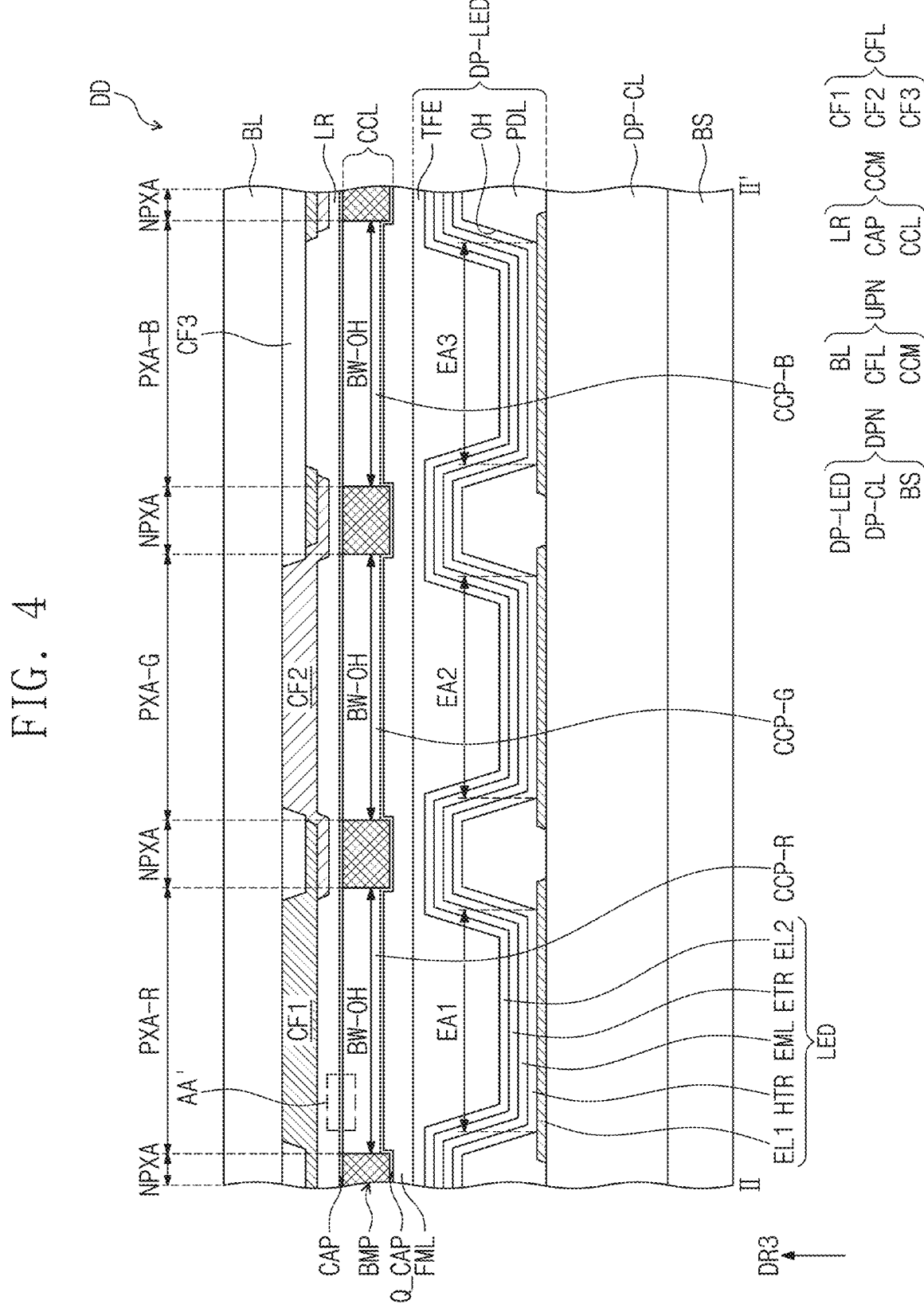
FIG. 4 is a schematic cross-sectional view showing a portion corresponding to line II-II' of FIG. 3.
Figure 5:
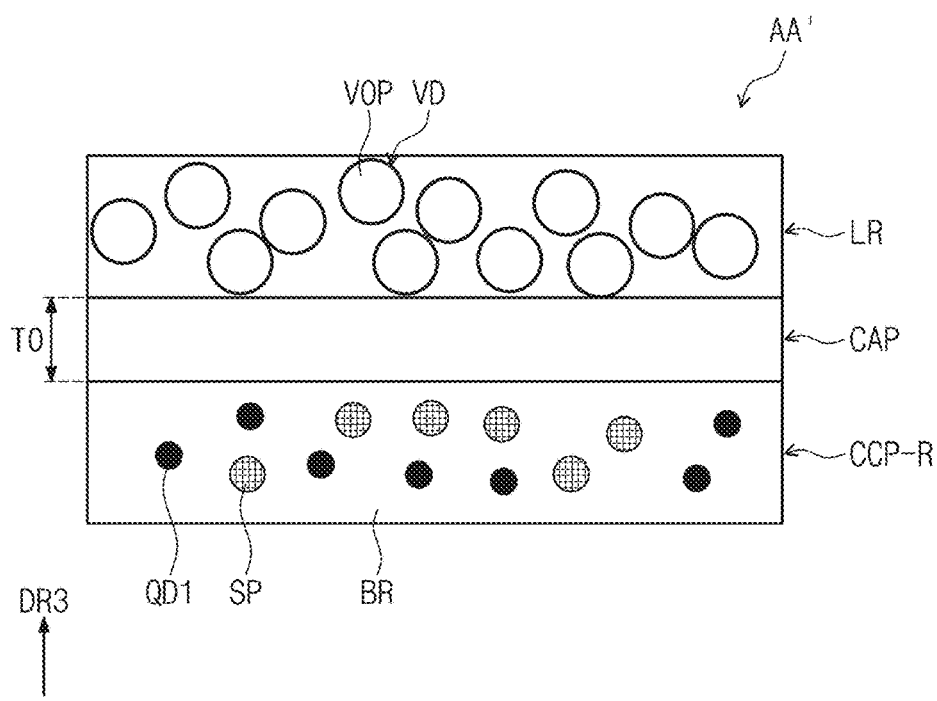
FIG. 5 is a schematic cross-sectional view showing region AA' of FIG. 4.

FIG. 3 is a schematic plan view of an enlarged portion of the display device DD according to an embodiment. FIG. 4 is a schematic cross-sectional view showing a portion corresponding to line II-II' of FIG. 3. FIG. 5 is a schematic cross-sectional view showing enlarged region AA' of FIG. 4.

FIG. 3 illustrates a plane including three pixel regions PXA-R, PXA-B, and PXA-G and a bank well region BWA adjacent thereto. The three pixel regions PXA-R, PXA-B, and PXA-G illustrated in FIG. 3 may be repeatedly disposed throughout the display region DA (see FIG. 1).

A peripheral region NPXA may be disposed around first to third pixel regions PXA-R, PXA-B, and PXA-G. The peripheral region NPXA may set the boundaries of the first to third pixel regions PXA-R, PXA-B, and PXA-G. The peripheral region NPXA may surround the first to third pixel regions PXA-R, PXA-B, and PXA-G. In the peripheral region NPXA, a structure for preventing color mixing between the first to third pixel regions PXA-R, PXA-B, and PXA-G, for example, a pixel definition film PDL (see FIG. 4), a bank BMP (see FIG. 4), or the like may be disposed.

FIG. 3 illustrates that the first to third pixel regions PXA-R, PXA-B, and PXA-G are in the same shape on a plane, and have different areas on a plane, but the embodiment is not limited thereto. Areas of two or more pixel regions among the first to third pixel regions PXA-R, PXA-B, and PXA-G may be the same. The area of each of the first to third pixel regions PXA-R, PXA-B, and PXA-G may be set according to an emitted color. Among primary colors, the area of a pixel region which emits red light may be the largest, and the area of a pixel region which emits blue light may be the smallest.

In FIG. 3, each of the first to third pixel regions PXA-R, PXA-B, and PXA-G is illustrated in a rectangular shape on a plane. On the other hand, each of the first to third pixel regions PXA-R, PXA-B, and PXA-G may be in a different polygonal shape, such as a rhombic shape or a pentagonal shape. Each of the first to third pixel regions PXA-R, PXA-B, and PXA-G may have a rectangular shape with round corners.

FIG. 3 illustrates that a second pixel region PXA-G is disposed on a first row, and a first pixel region PXA-R and a third pixel region PXA-B are disposed on a second row. However, according to embodiments, the disposition of the first to third pixel regions PXA-R, PXA-B, and PXA-G may be variously changed. For example, the first to third pixel regions PXA-R, PXA-B, and PXA-G may be disposed on the same row.

One of the first to third pixel regions PXA-R, PXA-B, and PXA-G may emit a first light, another thereof may emit a second light different from the first light, and the other thereof may emit a third light which may be different from the first light and the second light. The first pixel region PXA-R may emit red light, the second pixel region PXA-G may emit green light, and the third pixel region PXA-B may emit blue light.

In the display region DA (see FIG. 1), the bank well region BWA may be defined. The bank well region BWA may be a region formed to prevent defects caused by erroneous adhesion during a process of patterning light control parts CCP-R, CCP-G, and CCP-B which may be included in a light control layer CCL (see FIG. 4). The bank well region BWA may be a region from which a portion of the bank BMP (see FIG. 4) is removed. FIG. 3 illustrates that two bank well regions BWA are defined to be adjacent to the second pixel region PXA-G, but the embodiment is not limited thereto. The shape and disposition of the bank well region BWA may be variously changed.

Referring to FIG. 4, the lower panel DPN may include a base substrate BS, a circuit layer DP-CL disposed on the base substrate BS, and a display element layer DP-LED disposed on the circuit layer DP-CL. The upper panel UPN may include a light control member CCM, a color filter layer CFL disposed on the light control member CCM, and a base layer BL disposed on the color filter layer CFL.

The base substrate BS may be a member which provides a base surface on which the circuit layer DP-CL may be disposed. The base substrate BS may include a single layer or multiple layers. For example, the base substrate BS may include a three-layered structure of a polymer resin layer, an adhesive layer, and a polymer resin layer. For example, the polymer resin layer may include a polyimide-based resin. The polymer resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. In the disclosure, a polyimide-based resin means that a functional group of polyimide may be included. The same description may be applied to an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin.

The circuit layer DP-CL may include an insulation layer, a semiconductor pattern, a conductive pattern, a signal line, and the like. The circuit layer DP-CL may include transistors (not shown). Each of the transistors (not shown) may include a control electrode, an input electrode, and an output electrode. For example, the circuit layer DP-CL may include a switching transistor and a driving transistor for driving a light emission element LED of the display element layer DP-LED.

The display element layer DP-LED may include an organic light emission diode or a quantum dot light emission diode. For example, the display element layer DP-LED may include an organic light emission material or a quantum dot as a light emission material. The display element layer DP-LED may include a micro-light emission element. For example, the micro-light emission element may include a micro-LED element and/or a nano-LED element. The micro-light emission element has a micro- or nano-scale size, and may be a light emission element including an active layer disposed between semiconductor layers.

For example, the light emission element LED of the display element layer DP-LED may include a first electrode EL1, a second electrode EL2 facing the first electrode EL1, and a light emission layer EML disposed between the first electrode EL1 and the second electrode EL2. The light emission element LED may include a hole control layer HTR disposed between the first electrode EL1 and the light emission layer EML, and an electron control layer ETR disposed between the light emission layer EML and the second electrode EL2.

The first electrode EL1 may be an anode or a cathode. The first electrode EL1 may be a pixel electrode. The first electrode EL1 may be a transmissive electrode, a transflective electrode, or a reflective electrode. The second electrode EL2 may be a common electrode. The second electrode EL2 may be a cathode or an anode, but the embodiment is not limited thereto. For example, in case that the first electrode EL1 is an anode, the second electrode EL2 may be a cathode, and in case that the first electrode EL1 is a cathode, the second electrode EL2 may be an anode. The second electrode EL2 may be a transmissive electrode, a transflective electrode, or a reflective electrode.

Although not illustrated, an element capping layer may be provided on the second electrode EL2. The element capping layer may be a single layer or multiple layers. The element capping layer may include an alkali metal compound such as LiF, etc., an alkali earth metal compound such as $MgF_2$, etc., and an inorganic matter such as SiON, SiNx, SiOy, etc. On the other hand, the element capping layer may include α-NPD, NPB, TPD, m-MTDATA, $Alq_3$, CuPc, N4,N4,N4', N4'-tetra(biphenyl-4-yl)biphenyl-4,4'-diamine (TPD15), 4,4',4"-tris(carbazol-9-yl)triphenylamine (TCTA), or the like, or may include an epoxy resin, or an organic matter of acrylate and the like, such as methacrylate.

The light emission layer EML may emit the first light. For example, the light emission layer EML may generate blue light. The light emission layer EML may generate light in a wavelength region in a range of about 410 nm to about 480 nm. FIG. 4 illustrates the light emission element LED including one light emission layer EML, but the light emission element LED may include light emission layers. For example, the light emission element LED may be a light emission element having a tandem structure.

The hole control layer HTR may include a hole transport layer, and may further include a hole injection layer and/or an electron blocking layer. The electron control layer ETR may include an electron transport layer, and may further include an electron injection layer and/or a hole blocking layer.

FIG. 4 illustrates that the hole control layer HTR, the light emission layer EML, and the electron control layer ETR are provided as common layers, but the embodiment is not limited thereto. For example, the hole control layer HTR, the light emission layer EML, and/or the electron control layer ETR may be patterned and provided in a light emission opening OH defined by the pixel definition film PDL.

The display element layer DP-LED may include the pixel definition film PDL. The light emission opening OH may be defined on the pixel definition film PDL, and the light emission opening OH may expose at least a portion of the first electrode EL1. First to third light emission regions EA1, EA2, and EA3 may be defined by the light emission opening OH.

The pixel definition film PDL may include an organic matter.

The first light emission region EA1, the second light emission region EA2, and the third light emission region EA3 may be regions divided by the pixel definition film PDL. The first light emission region EA1, the second light emission region EA2, and the third light emission region EA3 may respectively correspond to the first pixel region PXA-R, the second pixel region PXA-G, and the third pixel region PXA-B. The light emission regions EA1, EA2, and EA3 may overlap the pixel regions PXA-R, PXA-G, and PXA-B, and may not overlap the bank well region BWA (see FIG. 3). On a plane defined by the first direction axis DR1 and the second direction axis DR2, areas of the light emission regions EA1, EA2, and EA3 may be smaller than areas of the pixel regions PXA-R, PXA-G, and PXA-B.

The display element layer DP-LED may include an encapsulation layer TFE disposed on the second electrode EL2. The encapsulation layer TFE may include an organic matter and/or an inorganic matter. The encapsulation layer TFE may include at least one organic layer and at least one inorganic layer. For example, the encapsulation layer TFE may include a multi-layered structure in which a first inorganic layer, an organic layer, and a second inorganic layer are sequentially stacked. The first inorganic layer and the second inorganic layer of the encapsulation layer TFE may protect the light emission element LED from external moisture and/or oxygen, and the organic layer of the encapsulation layer TFE may prevent imprint defects of the light emission element LED caused by foreign substances introduced during a manufacturing process.

The base layer BL of the upper panel UPN may be a member which provides a base surface on which the color filter layer CFL and the light control member CCM are disposed. For example, the base layer BL may be a glass substrate, a metal substrate, a plastic substrate, or the like. However, the embodiment is not limited thereto, and the base layer BL may be an inorganic layer, an organic layer, or a composite material layer. Unlike what is illustrated, in the display device DD of an embodiment, the base layer BL may be omitted. Although not illustrated, on the base layer BL, a functional layer such as an anti-reflection layer, an anti-fingerprint layer, a hard coating layer, and the like may be further disposed.

The color filter layer CFL may include first to third filters CF1, CF2, and CF3. The first to third filters CF1, CF2, and CF3 may be disposed to respectively correspond to the first to third light control parts CCP-R, CCP-G, and CCP-B of the light control layer CCL. The first filter CF1 may transmit the second light, the second filter CF2 may transmit the third light, and the third filter CF3 may transmit the first light. For example, the first filter CF1 may be a red filter, the second filter CF2 may be a green filter, and the third filter CF3 may be a blue filter.

Each of the first to third filters CF1, CF2, and CF3 may include a polymer photosensitive resin and a colorant. The first filter CF1 may include a red colorant, the second filter CF2 may include a green colorant, and the third filter CF3 may include a blue colorant. The first filter CF1 may include a red pigment or a red dye, the second filter CF2 may include a green pigment or a green dye, and the third filter CF3 may include a blue pigment or a blue dye.

Unlike what is illustrated in FIG. 4, the color filter layer CFL may include a light blocking member (not shown) which distinguishes boundaries between the first to third filters CF1, CF2, and CF3 adjacent to each other. The light blocking member may be formed of a blue filter, or may be formed by including an organic light blocking material or an inorganic light blocking material which includes a black pigment or a black dye.

In an embodiment, the light control member CCM may include the light control layer CCL, a low refractive layer LR disposed on the light control layer CCL, and a capping layer CAP disposed between the low refractive layer LR and the light control layer CCL. The light control layer CCL may include the first to third light control parts CCP-R, CCP-G, and CCP-B. The light control layer CCL may include the bank BMP and a sub-barrier layer Q-CAP.

The bank BMP may include a base resin and an additive. The base resin may be formed of various resin compositions which may be commonly referred to as a binder. The additive may include a coupling agent and/or a photo initiator. The additive may further include a dispersant.

The bank BMP may include a black coloring agent to block light. The bank BMP may include a black dye and/or a black pigment mixed in the base resin. In an embodiment, the black coloring agent may include carbon black, or may include a metal such as chromium or an oxide thereof.

The sub-barrier layer Q_CAP may be disposed on one surface of the light control layer CCL. One surface of the light control layer CCL may be adjacent to the display element layer DP-LED, and the other surface of the light control layer CCL may be adjacent to the color filter layer CFL. The sub-barrier layer Q_CAP may include a single layer or multiple layers. The sub-barrier layer Q_CAP may include an organic film and/or an inorganic film. The sub-barrier layer Q_CAP may be for removing steps defined by the bank BMP and the light control parts CCP-R, CCP-G, and CCP-B, and for providing a flat base surface to a member to be disposed on an upper side.

A bank opening BW-OH corresponding to the light emission opening OH may be defined in the bank BMP. On a plane, the bank opening BW-OH overlaps the light emission opening OH, and may have an area greater than that of the light emission opening OH. For example, the bank opening BW-OH may have an area greater than those of the light emission regions EA1, EA2, and EA3 defined by the light emission opening OH. In the disclosure, the term "correspond to" indicates that two components overlap each other when viewed in the thickness direction DR3, and the two components are not limited to having the same area and the same shape. The two components may have the different area and/or the different shape. The first to third light control parts CCP-R, CCP-G, and CCP-B may be provided inside the bank opening BW-OH.

The first to third light control parts CCP-R, CCP-G, and CCP-B may be spaced apart from each other. The first to third light control parts CCP-R, CCP-G, and CCP-B may be spaced apart by the bank BMP. A first light control part CCP-R may convert the first light emitted from the light emission layer EML into the second light. A second light control part CCP-G may convert the first light into the third light. The third light control part CCP-B may transmit the first light. The first light control part CCP-R may convert blue light into red light. The second light control part CCP-G may convert blue light into green light. The third light control part CCP-B may transmit blue light.

The light control layer CCL may include quantum dots. The first light control part CCP-R may include a first quantum dot QD1 (see FIG. 5) configured to convert the first light into the second light, and the second light control part CCP-G may include a second quantum dot configured to convert the first light into the third light. For example, the first quantum dot may be a red quantum dot, and the second quantum dot may be a green quantum dot. The third light control part CCP-B may not include quantum dots. Each of the first to third light control parts CCP-R, CCP-G, and CCP-B may include a base resin BR (see FIG. 5) and a scatterer SP (see FIG. 5).

A quantum dot may have a core-shell structure, and the core of the quantum dot may be selected from a Group II-VI compound, a Group III-VI compound, a Group I-III-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$, $In_2Se_3$, and the like, a ternary compound such as $InGaS_3$, $InGaSe_3$, and the like, or any combination thereof.

The Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$, $CuInGaS_2$, and the like.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP or the like may be selected as the Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration, or may be present in the same particle with a partially different concentration distribution. The quantum dot may have a core-shell structure in which one quantum dot surrounds another quantum dot. In the core-shell structure, the concentration of an element present in the shell may have a concentration gradient which becomes lower toward the core.

In some embodiments, a quantum dot may have the above core-shell structure including a core having nano-crystals and a shell surrounding the core. The shell of the quantum dot may serve as a protection layer to prevent the chemical deformation of the core so as to maintain semiconductor properties, and/or a charging layer to impart electrophoresis properties to the quantum dot. The shell may be a single layer or multiple layers. An example of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$. However, the embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, the embodiments are not limited thereto.

A quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or about 30 nm. Within these ranges, color purity or color reproducibility may be improved. Light emitted through such a quantum dot may be emitted in all directions, so that a wide viewing angle may be improved.

The form of a quantum dot may be a form that is used in the related art, without limitation. For example, the quantum dot may have a spherical form, a pyramidal form, a multi-arm form, or a cubic form, or the quantum dot may be in the form of nanoparticles, nanotubes, nanowires, nanofibers, nanoplate particles, and the like.

A quantum dot may control the color of emitted light according to the particle size thereof, and accordingly, the quantum dot may emit various colors such as blue, red, green, and the like. The first quantum dot QD1 of the first light control part CCP-R may emit red light. The second quantum dot of the second light control part CCP-G may emit green light. Among quantum dots including the same core, the size of a quantum dot which emits light of relatively a long wavelength may be bigger than the size of a quantum dot which emits light of relatively a short wavelength. For example, the first quantum dot QD1 and the second quantum dot may include the same core, and the particle size of the first quantum dot which emits red light may be bigger than the particle size of the second quantum dot which emits green light. However, the embodiment is not limited thereto. In quantum dots including the same core, the size of particles of a quantum dot may be controlled according to materials for forming a shell and the thickness of the shell.

The base resin BR may be a medium in which the quantum dot QD1 and the scatterer SP may be dispersed, and may be formed of various resin compositions which may be commonly referred to as a binder. For example, the base resin BR may be an acrylic resin, a urethane-based resin, a silicone-based resin, an epoxy resin, or the like. The base resin BR may be an optically transparent resin.

The scatterer SP may be an inorganic particle. For example, the scatterer SP may include at least one of $TiO_2$, $ZnO$, $Al_2O_3$, $SiO_2$, or hollow silica. The scatterer SP may include any one of $TiO_2$, $ZnO$, $Al_2O_3$, $SiO_2$, and hollow silica, or may be a mixture of two or more materials selected from $TiO_2$, $ZnO$, $Al_2O_3$, $SiO_2$, and hollow silica.

The low refractive layer LR may be disposed on the light control layer CCL. The low refractive layer LR may be disposed in an upper portion of the light control layer CCL and block the first to third light control parts CCP-R, CCP-G, and CCP-B from being exposed to moisture/oxygen. The low refractive layer LR may be disposed between the light control layer CCL and the color filter layer CFL and function as an optical functional layer such as increasing light extraction efficiency, or preventing reflected light from being incident on the light control layer CCL. The low refractive layer LR may be a layer with a small refractive index compared to an adjacent layer. For example, the refractive index of the low refractive layer LR may be about 1.3 or less. However, according to embodiments, the refractive index of the low refractive layer LR is not limited thereto.

The low refractive layer LR may include at least one inorganic layer. For example, the low refractive layer LR may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride, or a metal thin film having light transmittance, and the like. However, the embodiment is not limited thereto, and the low refractive layer LR may include an organic film. For example, the low refractive layer LR may be formed by including a polymer resin, inorganic particles, and the like. The low refractive layer LR may include a single layer or multiple layers.

FIG. 5 is a schematic cross-sectional view showing the light control member CCM according to an embodiment of the inventive concept. Referring to FIG. 5, the low refractive layer LR may include hollow particles VD. Each of the hollow particles VD may include a hollow portion VOP filled with air or filled with liquid.

The capping layer CAP may contact the low refractive layer LR and the light control layer CCL. The capping layer CAP may be formed on one surface of the low refractive layer LR by a chemical vapor deposition (CVD) method.

A number of seams may be generated in a capping layer contacting a low refractive layer including the hollow particles. In case that moisture/oxygen and the like are introduced into a seam, the deterioration of quantum dots, and the like occur, so that the reliability of a display device may be degraded.

In an embodiment, the capping layer CAP may include a first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %. The first silicon oxynitride included in the capping layer CAP may have a higher ratio of oxygen atoms than the ratio of nitrogen atoms. Since the capping layer CAP of an embodiment includes the first silicon oxynitride which satisfies a composition ratio, seams may be reduced to a minimum. Accordingly, film properties of the capping layer CAP such as durability and water vapor transmission rate may be improved, and the light control member CCM and the display device DD which include the capping layer CAP may exhibit excellent reliability.

The capping layer CAP of an embodiment may have a ratio of oxygen atoms to silicon atoms in a range of about 1.0 to about 2.0. For example, the capping layer CAP may have a ratio of oxygen atoms to silicon atoms in a range of about 1.76 to about 1.95. More specifically, the capping layer CAP may have a ratio of oxygen atoms to silicon atoms in a range of about 1.8 to about 1.9. Since the capping layer CAP satisfies a composition ratio, the amount of gas and the amount of released gas in the capping layer CAP may be maintained at a good level, the water vapor transmission rate may be improved, and the film durability may be improved.

A thickness T0 of the capping layer CAP may be in a range of about 3,000 Å to less than about 8,000 Å. For example, the thickness T0 of the capping layer CAP may be in a range of about 4,000 Å to about 6,000 Å. A capping layer having a thickness of less than about 3,000 Å has degraded film durability. A capping layer having a thickness of about 8,000 Å or greater exhibits high reflectance. In an embodiment, the capping layer CAP having the thickness TO of about 3,000 Å to less than about 8,000 Å may exhibit properties of having excellent film durability and reflectance.

The refractive index of the capping layer CAP may be greater than the refractive index of the low refractive layer LR, and may be equal to or less than the refractive index of the light control layer CCL. The refractive index of the capping layer CAP including the first silicon oxynitride may be about 1.35 or greater. The refractive index of the capping layer CAP may be about 1.60 or less. For example, the refractive index of the capping layer CAP may be in a range of about 1.40 to about 1.50. More specifically, the refractive index of the capping layer CAP may be in a range of about 1.43 to about 1.47. In an embodiment, the capping layer CAP having a refractive index in a range of about 1.35 to about 1.60 may have light efficiency and reflectance which are maintained at an excellent level. The light control member CCM and the display device DD which may include the capping layer CAP having a refractive index in a range of about 1.35 to about 1.60 may exhibit properties of having excellent light efficiency and reflectance. On the other hand, a capping layer having a refractive index of greater than about 1.60 may have degraded light efficiency and reflectance.

Figure 6:
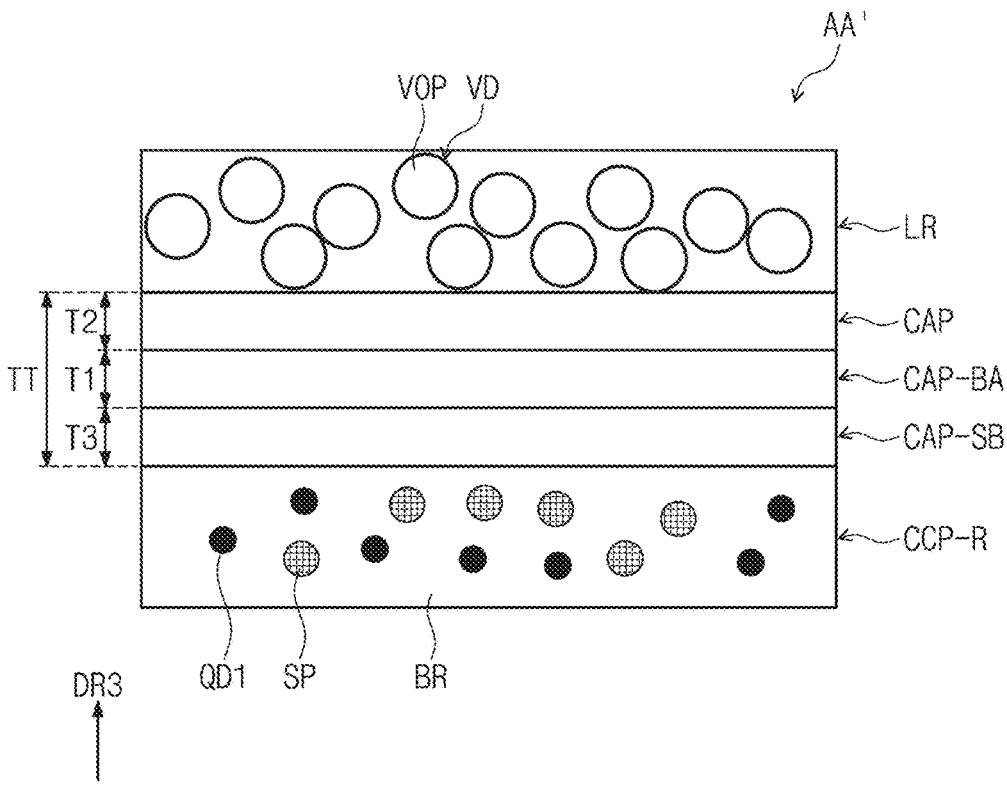
FIG. 6 is a schematic cross-sectional view showing a light control member according to an embodiment.
Figures 7, 8:
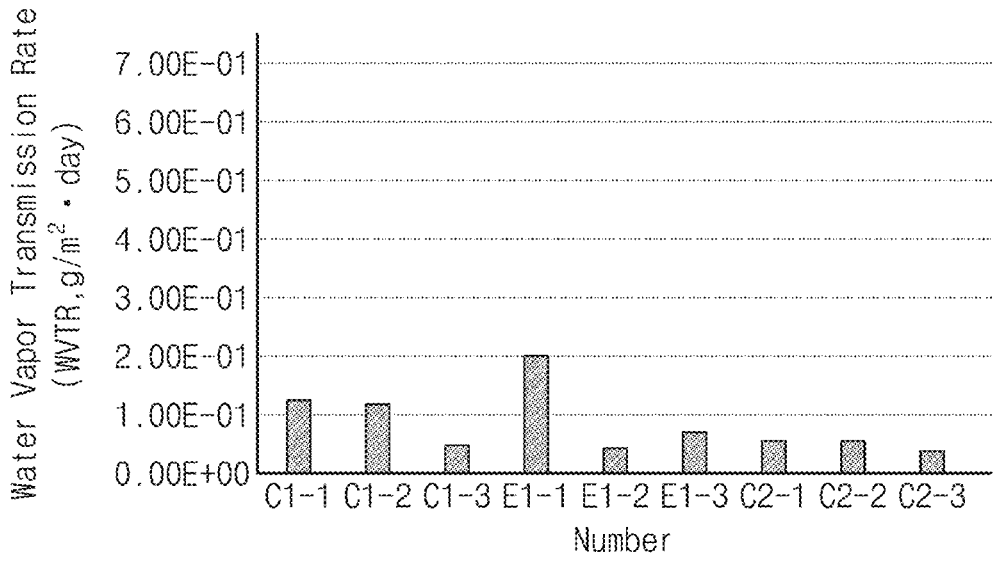
FIG. 7 is a schematic cross-sectional view showing a light control member according to an embodiment.
FIG. 8 is a graph showing water vapor transmission rates of Comparative Examples and Experimental Examples.

FIG. 6 and FIG. 7 show another embodiment of the light control member CCM, and illustrate that a barrier layer CAP-BA and a sub-capping layer CAP-SB are further disposed between the low refractive layer LR and the first light control part CCP-R. In an embodiment, the barrier layer CAP-BA may be disposed between the capping layer CAP and the light control layer CCL or between the capping layer CAP and the low refractive layer LR. The sub-capping layer CAP-SB may be disposed between the barrier layer CAP-BA and the light control layer CCL or between the barrier layer CAP-BA and the low refractive layer LR.

Referring to FIG. 6, the barrier layer CAP-BA may be disposed between the capping layer CAP and the first light control part CCP-R, and the sub-capping layer CAP-SB may be disposed between the barrier layer CAP-BA and the light control layer CCL. For example, with respect to the thickness direction DR3, the sub-capping layer CAP-SB, the barrier layer CAP-SB, and the capping layer CAP may be sequentially stacked. With reference to FIG. 6, the same contents as those described above with reference to FIG. 1 to FIG. 5 will not be described again. Instead, differences will be described.

The barrier layer CAP-BA may be disposed between the capping layer CAP and the sub-capping layer CAP-SB. In an embodiment, the refractive index of the barrier layer CAP-BA may be greater than the refractive index of the capping layer CAP and may be greater than the refractive index of the sub-capping layer CAP-SB. The refractive index of the barrier layer CAP-BA may be in a range of about 1.59 to about 1.89. The barrier layer CAP-BA having a refractive index in a range of about 1.59 to about 1.89 may exhibit a good level of light efficiency and reflectance.

The barrier layer CAP-BA may include silicon nitride or a second silicon oxynitride. The second silicon oxynitride may have a higher ratio of nitrogen atoms than the ratio of oxygen atoms. The second silicon oxynitride may be N-rich silicon oxynitride. More specifically, the second silicon oxynitride may include about greater than or equal to 5 at % of nitrogen atoms.

For example, the barrier layer CAP-BA may be formed by a chemical vapor deposition method. The second silicon oxynitride having a higher ratio of nitrogen atoms than the ratio of oxygen atoms and silicon nitride not containing oxygen atoms but containing nitrogen atoms may exhibit properties of having high film density. Accordingly, seams may not be generated in the barrier layer CAP-BA.

Each of the refractive index of the capping layer CAP and the refractive index of the sub-capping layer CAP-SB may each independently be in a range of about 1.41 to about 1.49.

In the light control member CCM further including the barrier layer CAP-BA, the refractive index of the capping layer CAP may be in a range of about 1.41 to about 1.49. The capping layer CAP and the sub-capping layer CAP-SB which have a refractive index in a range of about 1.41 to about 1.49 may exhibit a good level of efficiency and reflectance.

A thickness T1 of the barrier layer CAP-BA may be in a range of about 25% to about 74% of a total thickness TT of the capping layer CAP, the sub-capping layer CAP-SB, and the barrier layer CAP-BA. A thickness T2 of the capping layer CAP may be in a range of about 13% to about 62% of a total thickness TT of the capping layer CAP, the sub-capping layer CAP-SB, and the barrier layer CAP-BA. A thickness T3 of the sub-capping layer CAP-SB may be about 13% to about 38% of a total thickness TT of the capping layer CAP, the sub-capping layer CAP-SB, and the barrier layer CAP-BA. The total thickness TT of the capping layer CAP, the sub-capping layer CAP-SB, and the barrier layer CAP-BA may be in a range of about 3,000 Å to less than 8,000 Å.

For example, the thickness T1 of the barrier layer CAP-BA may be in a range of about 1,000 Å to about 5,920 Å. Seams may be generated in a barrier layer having a thickness of less than 1,000 Å. A barrier layer having a thickness of greater than about 5,920 Å exhibits high reflectance. The barrier layer CAP-BA having the thickness T1 in a range of about 1,000 Å to about 5,920 Å exhibits a good level of reflectance, and may exhibit properties of having improved film durability.

In an embodiment, the sub-capping layer CAP-SB may include silicon oxide or the first silicon oxynitride. For example, the sub-capping layer CAP-SB may include the first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %. The sub-capping layer CAP-SB may have a ratio of oxygen atoms to silicon atoms in a range of about 1.0 to about 2.0.

The thickness T2 of the capping layer CAP and the thickness T3 of the sub-capping layer CAP-SB may be about 500 Å or greater. Film degeneration may occur in a capping layer and a sub-capping layer which have a thickness of less than about 500 Å. The thickness T2 of the capping layer CAP disposed between the barrier layer CAP-BA and the low refractive layer LR may be in a range of about 500 Å to about 4,960 Å. The thickness T3 of the sub-capping layer CAP-SB disposed between the first light control part CCP-R and the barrier layer CAP-BA may be in a range of about 500 Å to about 3,040 Å.

Unlike FIG. 6, FIG. 7 illustrates that the barrier layer CAP-BA is disposed between the capping layer CAP and the low refractive layer LR, and the sub-capping layer CAP-SB is disposed between the barrier layer CAP-BA and the low refractive layer LR. For example, with respect to the thickness direction DR3, it is illustrated that the capping layer CAP, the barrier layer CAP-SB, and the sub-capping layer CAP-SB may be sequentially stacked. With reference to FIG. 7, the same contents as those described above with reference to FIG. 1 to FIG. 6 will not be described again. Instead, differences will be described.

A thickness T1 of the barrier layer CAP-BA may be in a range of about 25% to about 74% of a total thickness TT of the capping layer CAP, the sub-capping layer CAP-SB, and the barrier layer CAP-BA. A thickness T5 of the capping layer CAP may be in a range of about 13% to about 38% of a total thickness TT of the capping layer CAP, the sub-capping layer CAP-SB, and the barrier layer CAP-BA. A thickness T6 of the sub-capping layer CAP-BA may be in a range of about 13% to about 62% of a total thickness TT of the capping layer CAP, the sub-capping layer CAP-SB, and the barrier layer CAP-BA. The total thickness of the capping layer CAP, the sub-capping layer CAP-SB, and the barrier layer CAP-BA may be in a range about 3,000 Å to less than 8,000 Å.

For example, between the capping layer CAP and the sub-capping layer CAP-SB, a layer disposed between the barrier layer CAP-BA and the low refractive layer LR may have a thickness ratio in a range of about 13% to about 62%. Between the capping layer CAP and the sub-capping layer CAP-SB, a layer disposed between the barrier layer CAP-BA and the first light control part CCP-R may have a thickness ratio in a range of about 13% to about 38%. For example, between the capping layer CAP and the sub-capping layer CAP-SB, a layer disposed between the barrier layer CAP-BA and the low refractive layer LR may have a thickness in a range of about 500 Å to about 4,960 Å. Between the capping layer CAP and the sub-capping layer CAP-SB, a layer disposed between the barrier layer CAP-BA and the first light control part CCP-R may have a thickness in a range of about 500 Å to about 3,040 Å.

With respect to the thickness direction DR3, in case that a layer disposed in a lower portion of the barrier layer CAP-BA has a thickness of greater than about 3,040 Å, or in case that a layer disposed in an upper portion of the barrier layer CAP-BA has a thickness of greater than about 4,960 Å, the reflectance increases, or the efficiency decreases. In an embodiment, with respect to the thickness direction DR3, since the thicknesses of layers (capping layer and sub-capping layer) disposed in the upper and lower portions of the barrier layer CAP-BA satisfy ratios or values, the light control member CCM may have reflectance maintained at a good level, and may exhibit excellent efficiency.

Hereinafter, referring to Examples (or Experimental Examples) and Comparative Examples, a light control member according to an embodiment, and a display device including the light control member will be described in detail. Examples shown below are for illustrative purposes only to facilitate the understanding of embodiments, and thus, the scope is not limited thereto.

FIG. 8 shows the evaluation of water vapor transmission rate (WVTR) in Comparative Examples C1-1 to C1-3, Comparative Examples C2-1 to C2-3, and Experimental Examples E1-1 to E1-3. Experimental Examples E1-1 to E-1-3 are specimens of the capping layer which may include the first silicon oxynitride according to an embodiment. Comparative Examples C-1 to C1-3 are specimens of a capping layer including silicon oxide, and Comparative Examples C2-1 to C2-3 are specimens of a capping layer including silicon nitride. For example, the specimens of Comparative Examples C-1 to C1-3 do not include nitrogen atoms unlike the capping layer of an embodiment, and the specimens of Comparative Examples C2-1 to C2-3 do not include oxygen atoms.

Comparative Example C1-1, Comparative Example C2-1, and Experimental Example E1-1 have a thickness of about 1,000 Å. Comparative Example C1-2, Comparative Example C2-2, and Experimental Example E1-2 have a thickness of about 4,000 Å. Comparative Example C1-3, Comparative Example C2-3, and Experimental Example E1-3 have a thickness of about 8,000 Å. For example, Experimental Example E1-2 satisfies the thickness range of the capping layer CAP according to an embodiment. The thickness of the capping layer CAP according to an embodiment may be in a range of about 3,000 Å to about less than 8,000 Å.

Compared to Comparative Example C1-2 and Comparative Example C2-2 which have the same thickness as the thickness of Experimental Example E1-2, it can be seen that Experimental Example E1-2 may exhibit an excellent water vapor transmission rate. It may be determined that Experimental Example E1-2 includes the first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %, and thus, exhibits a low water vapor transmission rate.

When compared to Experimental Example E1-2, it can be seen that Experimental Example E1-1 and Experimental Example E1-3 have high water vapor transmission rates. It may be determined that Experimental Example E1-1 has a thickness of less than 3,000 Å, and Experimental Example E1-3 has a thickness of 8,000 Å or greater, and thus, they exhibit high water vapor transmission rates.

Table 1 shows the evaluation of film properties in Comparative Example 1 and Example 1. Comparative Example 1 is a light control member which includes a capping layer including silicon oxide. Example 1 may be a light control member according to an embodiment, which includes a capping layer including the first silicon oxynitride. More specifically, the capping layer of Example 1 contains about 0.4 at % of nitrogen, about 64.8 at % of oxygen, and about 34.8 at % of silicon. In Table 1, the "O/Si" shows as ratio of oxygen atoms to silicon atoms, the "amount of released hydrogen" shows an amount of hydrogen released from a capping layer, and the "amount of hydrogen in film" shows an amount of hydrogen in a capping layer. The results shown in Table 1 are according to X-ray reflectometery (XRR) analysis and X-ray photoelectron spectroscopy (XPS) analysis.

TABLE 1

| Classifications | Refractive index | O/Si (at %) | Film density (g/cm³) | Amount of released hydrogen (molec./cm³) | Amount of hydrogen in film (atoms/cm³) |
|---|---|---|---|---|---|
| Comparative Example 1 | 1.468 | 1.88 | 2.11 | 3.71E+20 | 1.20E+21 |
| Example 1 | 1.453 | 1.86 | 2.15 | 3.25E+20 | 1.27E+21 |

Referring to Table 1, it can be seen that, in Example 1, the capping layer has a ratio of oxygen atoms to silicon atoms in a range of about 1.0 to about 2.0, and has a refractive index in a range of about 1.36 to about 1.60. It can be seen that, compared to Comparative Example 1, Example 1 exhibits a desirable level of film density, amount of released hydrogen, and amount of hydrogen in film. Accordingly, the capping layer including the first silicon oxynitride according to an embodiment may exhibit a desirable level of water vapor transmission rate and durability.

Table 2 shows the evaluation of high-temperature reliability in Comparative Example B1, Comparative Example B2, Example A1, and Example A2. Under the temperature condition of 55° C., reliability over time was evaluated. Comparative Examples 2X and 2Y are light control members which include a capping layer including silicon oxide, and Examples 2A and 2B are light control members which may include the capping layer including the first silicon oxynitride according to an embodiment. For example, unlike the capping layer according to an embodiment, the capping layers of Comparative Examples 2X and 2Y do not include nitrogen atoms.

Figure 9A:
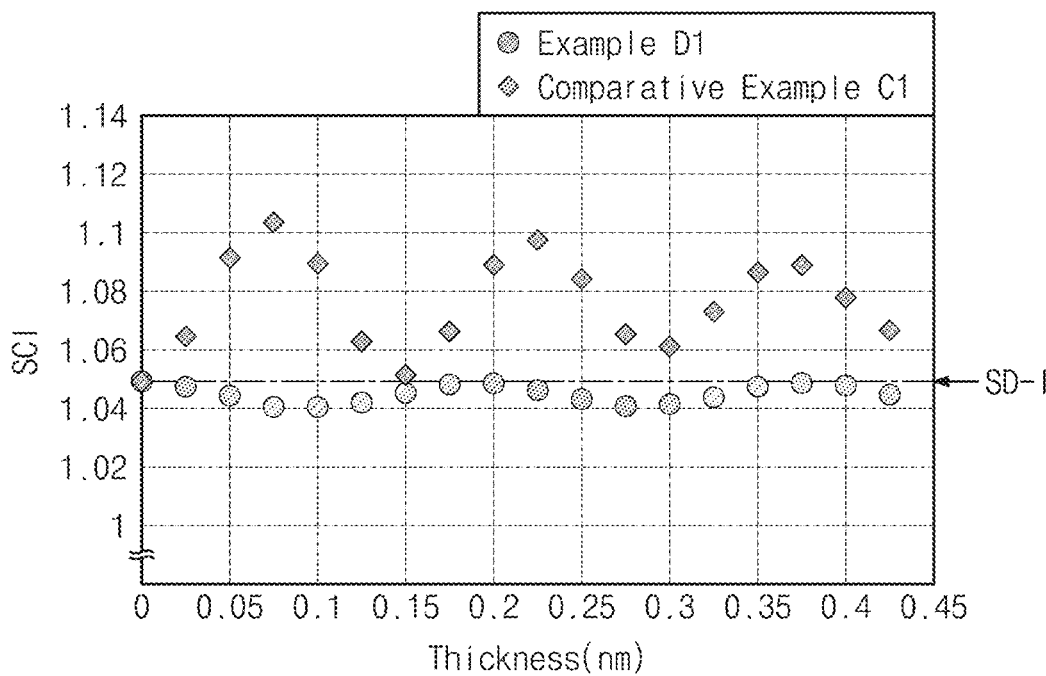
FIG. 9A is a graph showing the reflectance of SCI according to thickness.
Figure 9B:
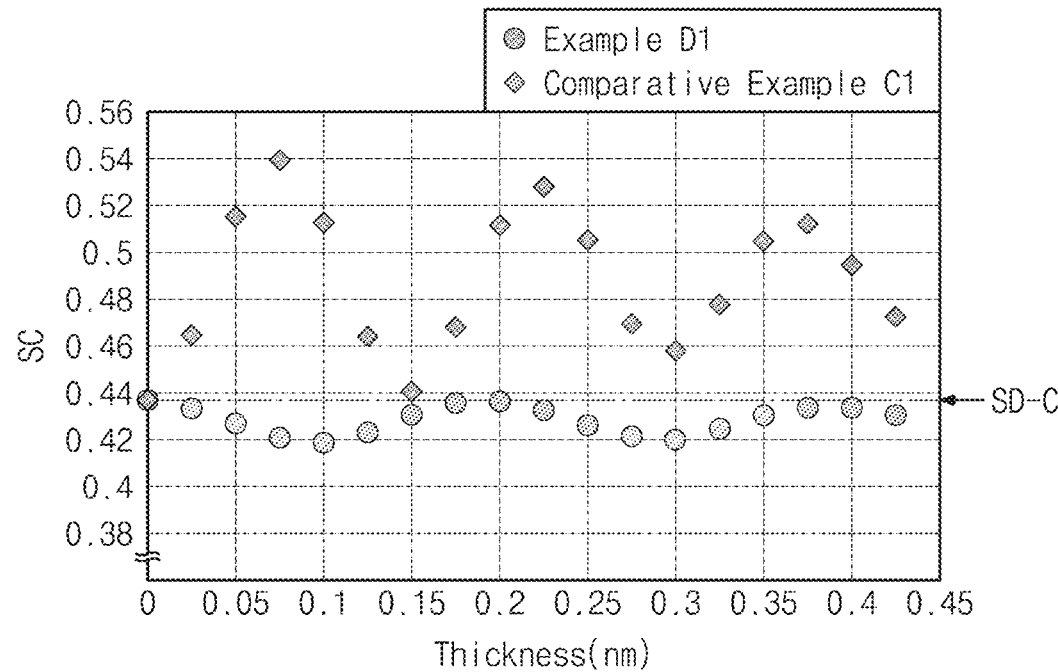
FIG. 9B is a graph showing the reflectance of SC according to thickness.
Figure 9C:
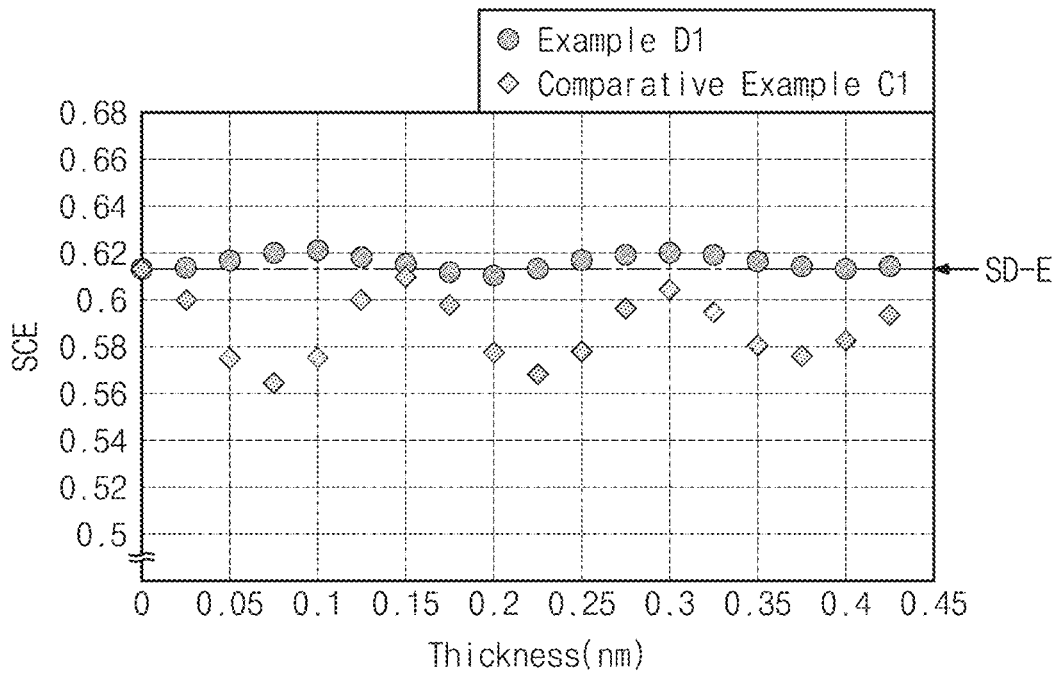
FIG. 9C is a graph showing the reflectance of SCE according to thickness.

The capping layers of Examples 2A and 2B contain about 0.4 at % of nitrogen, about 64.8 at % of oxygen, and about 34.8 at % of silicon, and have a ratio of oxygen atoms to silicon atoms of about 1.86. In Table 2, the "number of cells" may be the number of provided cells, and the "~/~ pieces" may be the number of defective cells. For example, "½ pieces" means that two cells were provided and one of them had defects. The "time" shows elapsed time. Comparative Example B1 was not evaluated after 750 hours had elapsed.

index of about 1.20, another low refractive layer having a refractive index of about 1.60, and a capping layer disposed between the low refractive layer and the another low refractive layer. In FIG. 9A to FIG. 9C, the capping layer of Comparative Example C1 includes silicon nitride, and the refractive index of the capping layer may be about 1.850. For example, unlike the capping layer according to an embodiment, the capping layer of Comparative Example C1 does not include oxygen atoms. FIG. 9A to FIG. 9C are simulation results.

The capping layer in Example D1 may be a capping layer according to an embodiment and includes the first silicon oxynitride, and the refractive index of the capping layer may be about 1.453. The capping layer in Example D1 may include about 0.4 at % of nitrogen, about 64.8 at % of oxygen, and about 34.8 at % of silicon, and has a ratio of oxygen atoms to silicon atoms of about 1.86.

FIG. 9A shows the reflectance of specular component included (SCI) according to the thickness of a capping layer. In FIG. 8A, SD-I shows the reflectance of SCI in case that the thickness of a capping layer is 0, which shows the reflectance of SCI in a light control member not including a capping layer. In FIG. 9A, in case that the thickness of about 0.4 nm, the reflectance of SCI of Comparative Example C1 is about 1.078, and the reflectance of SCI of Example D1 is about 1.048.

Referring to FIG. 9A, it can be seen that, compared to the reflectance of SCI in case that the thickness of the capping layer is 0, the reflectance of SCI of Comparative Example C1 is very high. It can be seen that, when compared to the reflectance of SCI in case that the thickness of the capping layer is 0, the reflectance of SCI of Example D1 may be improved. It can be seen that, when the thickness of the capping layer is in a range of about 0.3 nm to about 0.45 nm, Example D1 may exhibit a good level of reflectance of SCI. The thickness in a range of about 0.3 nm to about 0.45 nm satisfies the thickness range of the capping layer according to an embodiment. Accordingly, a light control member and a display device which may include the capping layer according to an embodiment may exhibit an improved reflectance of SCI.

FIG. 9B shows the reflectance of specular component (SC) according to the thickness of a capping layer. In FIG. 9B, SD-C shows the reflectance of SC in case that the

TABLE 2

| Classifications | Number of cells | Time (hour) | | | | | |
|---|---|---|---|---|---|---|---|
| | | 120 | 168 | 336 | 500 | 750 | 1000 |
| Example A1 | 4 or 2 | 0/4 pieces | 0/4 pieces | 0/4 pieces | 0/4 pieces | 0/4 pieces | 0/2 pieces |
| Comparative Example B1 | 2 | 0/2 pieces | 0/2 pieces | 0/2 pieces | 0/2 pieces | 1/2 pieces | — |
| Comparative Example B2 | 4 | 2/4 pieces | 2/4 pieces | 4/4 pieces | 4/4 pieces | 4/4 pieces | 2/2 pieces |
| Example A2 | 2 | 0/2 pieces | 0/2 pieces | 0/2 pieces | 0/2 pieces | 0/2 pieces | 0/2 pieces |

Referring to Table 2, it can be seen that, compared to Comparative Examples B1 and B2, Examples A1 and A2 exhibit excellent reliability for a long period of time at high temperatures. It may be determined that Examples A1 and A2 include the capping layer which may include the first silicon oxynitride according to an embodiment, and thus, exhibit excellent reliability.

FIG. 9A to FIG. 9C are graphs showing the reflectance according to the thickness of a capping layer. A light control member includes a low refractive layer having a refractive thickness of a capping layer is 0, which shows the reflectance of SC in a light control member not including a capping layer. In FIG. 9B, in case that the thickness of a capping layer is about 0.4 nm, the reflectance of SC of Comparative Example C1 is about 0.495, and the reflectance of SC of Example D1 is about 0.434.

Referring to FIG. 9B, it can be seen that, compared to the reflectance of SC in case that the thickness of the capping layer is 0, the reflectance of SC of Comparative Example C1 is very high. It can be seen that, when compared to the reflectance of SC in case that the thickness of the capping layer is 0, the reflectance of SC of Example D1 may be improved. It can be seen that, when the thickness of the capping layer is in a range of about 0.3 nm to about 0.45 nm, Example D1 exhibits a good level of reflectance of SC. The thickness of a capping layer in a range of about 0.3 nm to about 0.45 nm satisfies the thickness range of the capping layer according to an embodiment. Accordingly, a light control member and a display device which may include the capping layer according to an embodiment may exhibit an improved reflectance of SC.

FIG. 9C shows the reflectance of specular component excluded (SCE) according to the thickness of a capping layer. In FIG. 9C, SD-E shows the reflectance of SCE in case that the thickness of a capping layer is 0, which shows the reflectance of SCE in a light control member not including a capping layer.

Referring to FIG. 9C, it can be seen that, compared to the reflectance of SCE when the thickness of the capping layer is 0, the reflectance of SCE of Example D1 is good. It can be seen that, when the thickness of the capping layer is in a range of about 0.3 nm to about 0.45 nm, Example D1 exhibits a good level of reflectance of SCE. The thickness of about 0.3 nm to about 0.45 nm satisfies the thickness range of the capping layer according to an embodiment. Accordingly, a light control member and a display device which may include the capping layer according to an embodiment may exhibit good reflectance of SCE.

Figure 10A:
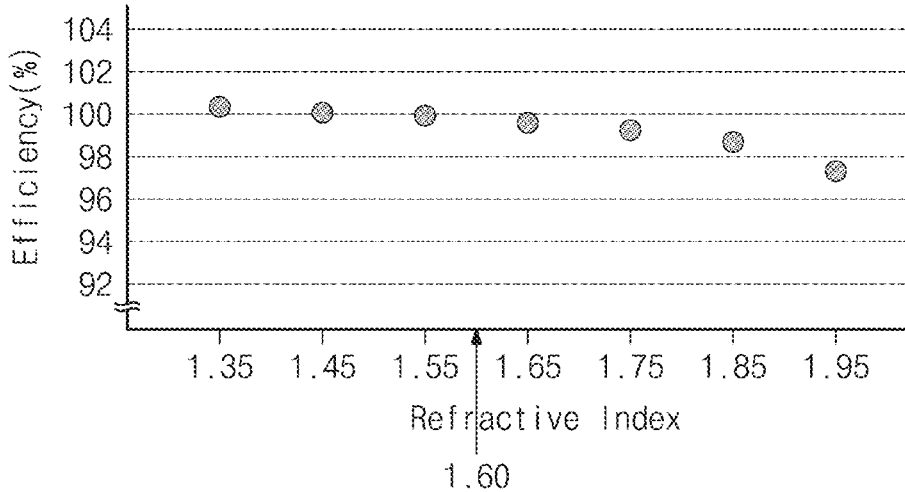
FIG. 10A is a graph showing the efficiency according to refractive index.

FIG. 10A shows the evaluation of efficiency according to refractive index, and the efficiency of white light. In FIG. 10A, the efficiency may be represented by a value relative to a value measured in a light control member including a capping layer having a refractive index of about 1.46, wherein the value is set to 100%. Table 3 shows the refractive indexes and efficiency values of FIG. 10A in detail. FIG. 10A and Table 3 are simulation results.

TABLE 3

| | Refractive index | | | | | | |
|---|---|---|---|---|---|---|---|
| | Ref. (1.46) | 1.35 | 1.45 | 1.55 | 1.65 | 1.75 | 1.85 | 1.95 |
| Efficiency (%) | 100 | 100.25 | 100.01 | 99.85 | 99.53 | 99.25 | 98.65 | 97.26 |

45

Referring to FIG. 10A and Table 3, it can be seen that in the refractive index range of about 1.35 to about 1.60, the efficiency is at a desirable level. It can be seen that in the refractive index range of about 1.65 or greater, the efficiency significantly decreases. Accordingly, a light control member and a display device which may include a capping layer having a refractive index in a range of about 1.35 to about 1.60 may exhibit desirable efficiency.

Figure 10B:
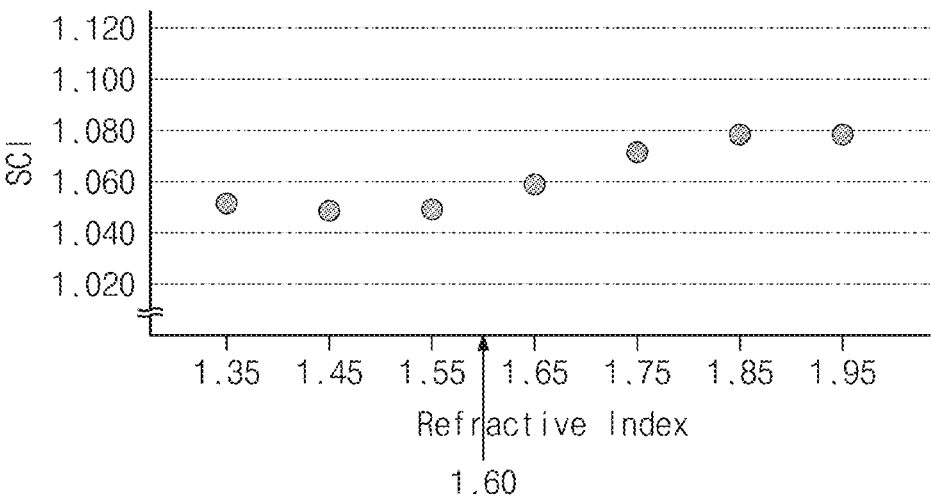
FIG. 10B is a graph showing the reflectance of SCI according to refractive index.
Figure 10C:
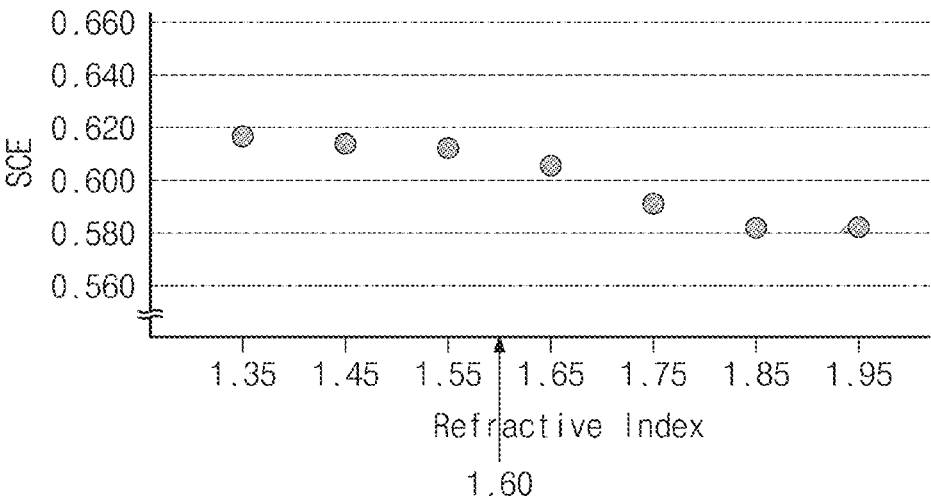
FIG. 10C is a graph showing the reflectance of SCE according to refractive index.
Figure 10D:
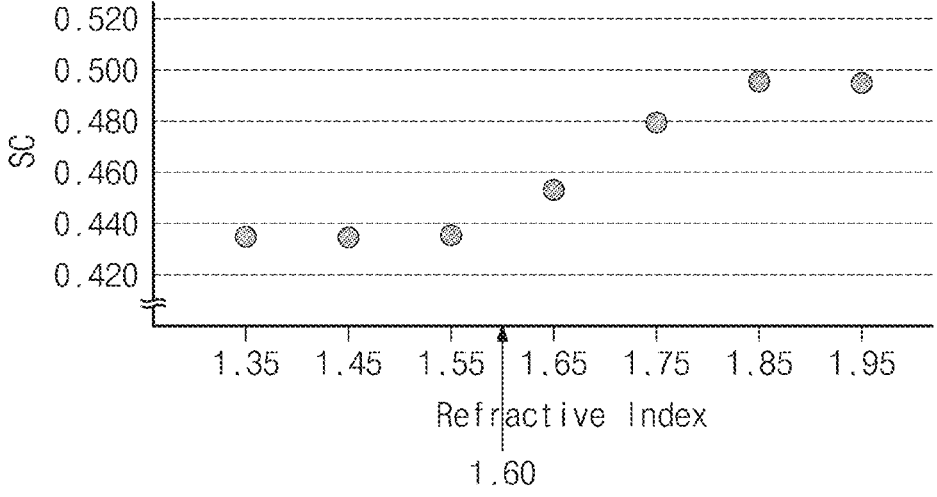
FIG. 10D is a graph showing the reflectance of SC according to refractive index.

FIG. 10B to FIG. 10D show the evaluation of the reflectance of SCI, reflectance of SCE, and reflectance of SC according to the refractive index of a capping layer. Table 4 shows the reflectance of SCI of FIG. 10B in detail. Table 5 shows the reflectance of SCE of FIG. 10C in detail. Table 6 shows the reflectance of SC of FIG. 10D in detail. In Table 4 to Table 6, Ref is a light control member of Reference Example X1 including a capping layer having a refractive index of about 1.46, and the light control member of Reference Example X1 has a reflectance of SCI of about 1.048, a reflectance of SCE of about 0.614, and a reflectance of SC of about 0.434. FIG. 10B to FIG. 10D and Table 4 to Table 6 are simulation results.

TABLE 4

| | Refractive index | | | | | | |
|---|---|---|---|---|---|---|---|
| | Ref. (1.46) | 1.35 | 1.45 | 1.55 | 1.65 | 1.75 | 1.85 | 1.95 |
| SCI | 1.048 | 1.052 | 1.048 | 1.049 | 1.059 | 1.071 | 1.078 | 1.078 |

Referring to FIG. 10B and Table 4, it can be seen that in the refractive index range of about 1.35 to about 1.60, the reflectance of SCI is excellent. It can be seen that in the refractive index of about greater than 1.06, the reflectance of SCI may be very high.

TABLE 5

| | Refractive index | | | | | | |
|---|---|---|---|---|---|---|---|
| | Ref. (1.46) | 1.35 | 1.45 | 1.55 | 1.65 | 1.75 | 1.85 | 1.95 |
| SCE | 0.614 | 0.617 | 0.614 | 0.613 | 0.606 | 0.592 | 0.583 | 0.584 |

TABLE 6

| | Refractive index | | | | | | |
|---|---|---|---|---|---|---|---|
| | Ref. (1.46) | 1.35 | 1.45 | 1.55 | 1.65 | 1.75 | 1.85 | 1.95 |
| SC | 0.434 | 0.435 | 0.434 | 0.436 | 0.453 | 0.480 | 0.495 | 0.494 |

Referring to FIG. 10C and Table 5, it can be seen that in the refractive index range of about 1.35 to about 1.60, the reflectance of SCE may be at a good level. Referring to FIG. 10D and Table 6, it can be seen that in the refractive index range of about 1.35 to about 1.60, the reflectance of SC may be excellent. It can be seen that in the refractive index of about greater than 1.06, the reflectance of SC may be very high. Accordingly, a light control member and a display device which may include a capping layer having a reflective index of about 1.35 to about 1.60 may exhibit excellent reflectance.

Figure 11A:
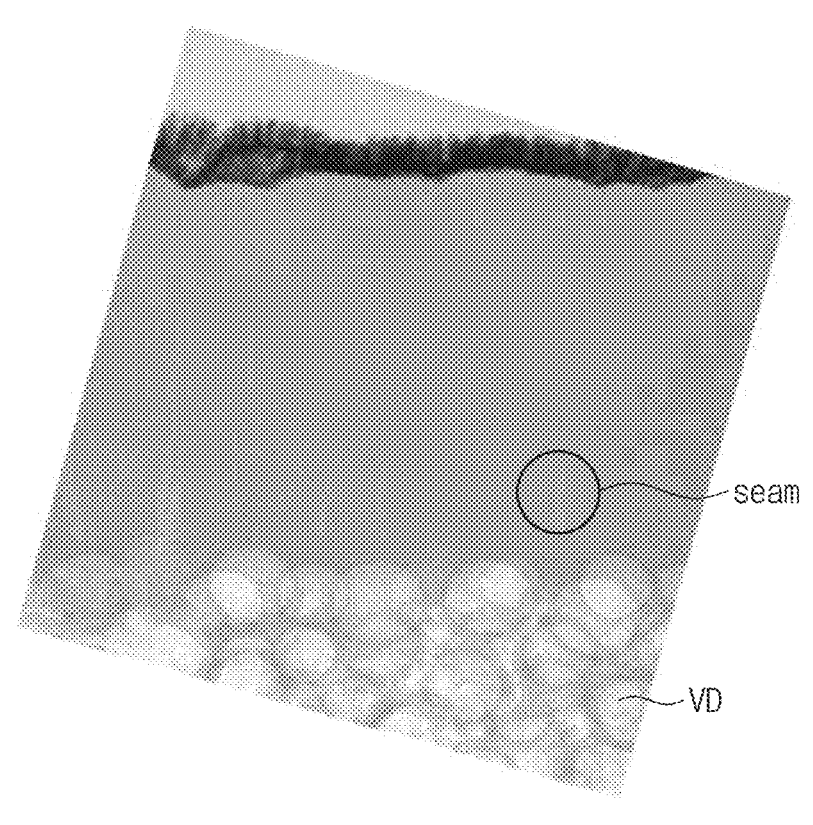
FIG. 11A is a microscopic captured image of a light control member according to an embodiment.
Figure 11B:
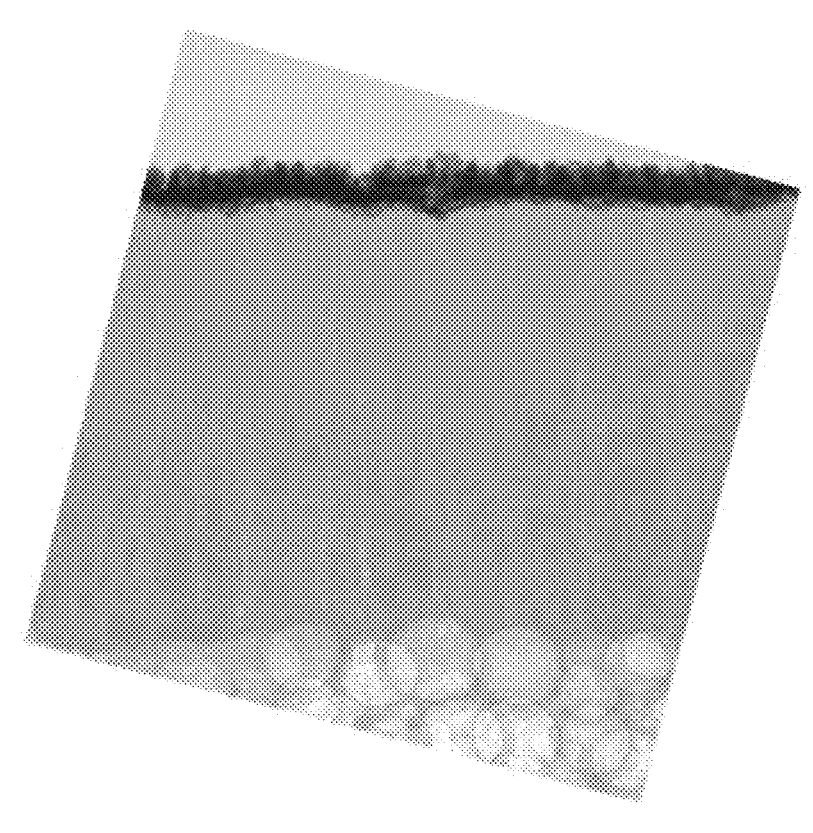
FIG. 11B is a microscopic captured image of a light control member according to a comparative example.

FIG. 11A and FIG. 11B are images of light control members including capping layers of Examples and Comparative Examples, which are captured with a transmission electron microscope (TEM). FIG. 11A is a captured image of a light control member which includes a capping layer including the first silicon oxynitride according to an embodiment, and FIG. 11B is a captured image of a light control member which includes a capping layer including silicon oxide. For example, unlike the capping layer according to an embodiment, the capping layer of FIG. 11B may not include nitrogen atoms.

Compared to FIG. 11B, it can be seen that in FIG. 11A, there are seams only in a portion adjacent to the hollow particles VD of a low refractive layer. It can be seen that there are seams in the entire region of the capping layer in FIG. 11B. Accordingly, the capping layer including the first silicon oxynitride which satisfies the composition ratio range according to an embodiment may exhibit properties of having improved film durability. A light control member including the capping layer of an embodiment and a display device including the light control member may exhibit excellent reliability.

Table 7 shows, in a light control member including a capping layer, a barrier layer, and a sub-capping layer, the evaluation of efficiency, reflectance, and white angle dependence (WAD) according to viewing angle in accordance with the thickness of each of the capping layer, the barrier layer, and the sub-capping layer. More specifically, in order to confirm the white angle dependence (WAD) according to a viewing angle, the luminance ratio and the color difference were evaluated, and the viewing angle was based on about 600 left and right from the front. The efficiency was evaluated using CAS 140 CT (Compact Array Spectrometer, KIMSOPTEC Co. Ltd.), and the reflectance was evaluated using a spectro colorimeter (product name CM-2600D, Konica Minolta Inc). The white angle dependence (WAD) according to viewing angle was evaluated using SR-3A (Spectro Radiometer—3A, Topcon Corporation).

In Comparative Example F1 to Comparative Example F3 and Example F1, the capping layer and the sub-capping layer may include the first silicon oxynitride containing an amount of nitrogen of about 0.4 at %, an amount of oxygen of about 64.8 at %, and an amount of silicon of about 34.8 at % of silicon. Comparative Example F3 includes one capping layer, two barrier layers, and two sub-capping layers, wherein a capping layer, a barrier layer, a sub-capping layer, a barrier layer, and a sub-capping layer may be sequentially stacked. In Comparative Example F3, the thickness of a sub-capping layer disposed relatively in a lower portion is about 1,000 Å, and the thickness of a sub-capping layer disposed relatively in an upper portion is about 1,500 Å. In Comparative Example F3, the thicknesses of the two barrier layers are the same, which is 500 Å. In Comparative Example F1 to Comparative Example F3 and Example F1, the refractive index of the barrier layer may be about 1.86.

In Table 7, the efficiency may be represented by a value relative to a light efficiency measured in a light control member of Reference Example X2, which does not include a barrier layer and a sub-capping layer but may include a capping layer, wherein the light efficiency is set to 100%. In Table 7, Ref may be the light control member of Reference Example X2, which does not include a barrier layer and a sub-capping layer but may include a capping layer.

In Example G1, the thickness of a barrier layer may be about 1,000 Å, which satisfies the thickness range of a barrier layer according to an embodiment. In Example G1, the thickness of a sub-capping layer may be about 2,500 Å, which satisfies the thickness range of a sub-capping layer according to an embodiment. Accordingly, a light control member of an embodiment which includes a capping layer, a barrier layer, and a sub-capping layer may exhibit excellent efficiency and reflectance, and a display device including the light control member of an embodiment may exhibit good display quality.

Referring to Table 7, it can be seen that, in Comparative Examples F1 to F3, the efficiency is degraded and the luminance ratio and the color difference are poor. It can be seen that the reflectance of Comparative Example F3 is very high. In Comparative Examples F1 and F2, the thickness of a barrier layer is less than about 1,000 Å, and Comparative Example F3 includes five components of one capping layer, two barrier layers, and two sub-capping layers.

Figure 12A:
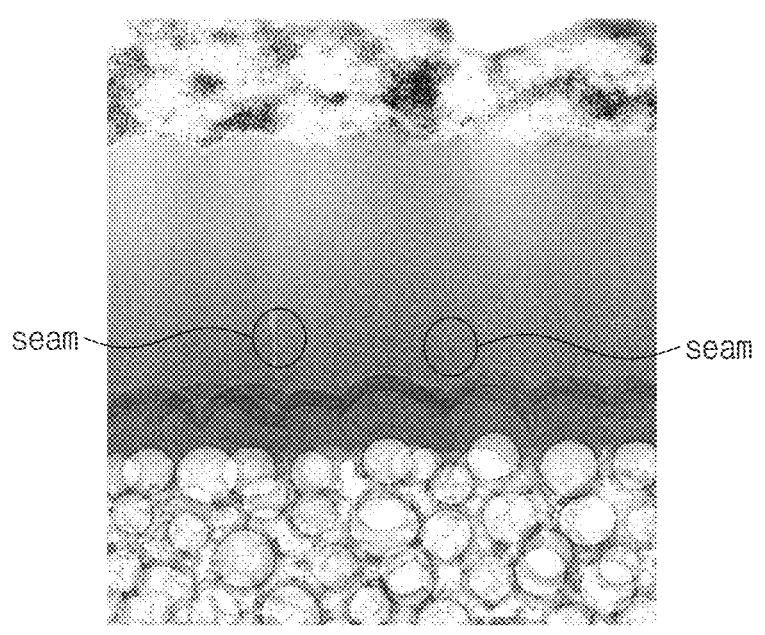
FIG. 12A is a microscopic captured image of a light control member according to a comparative example.
Figure 12B:
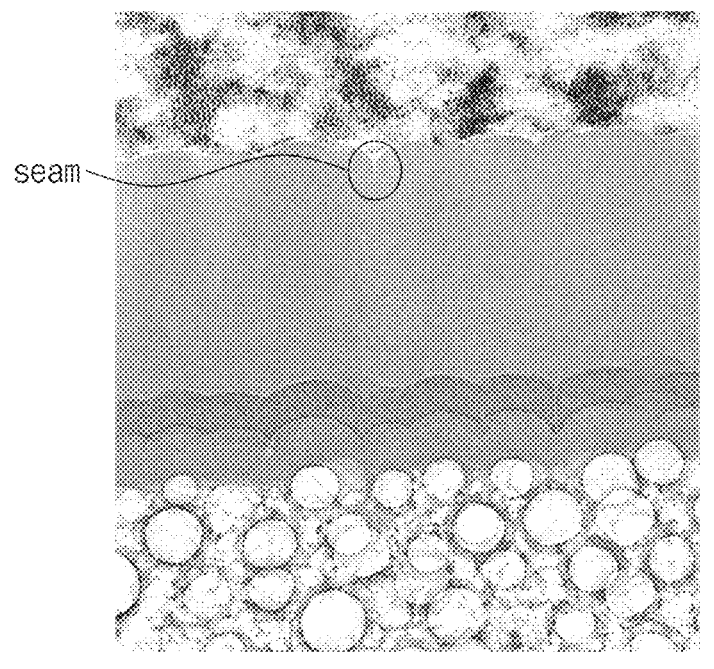
FIG. 12B is a microscopic captured image of a light control member according to a comparative example.
Figure 12C:
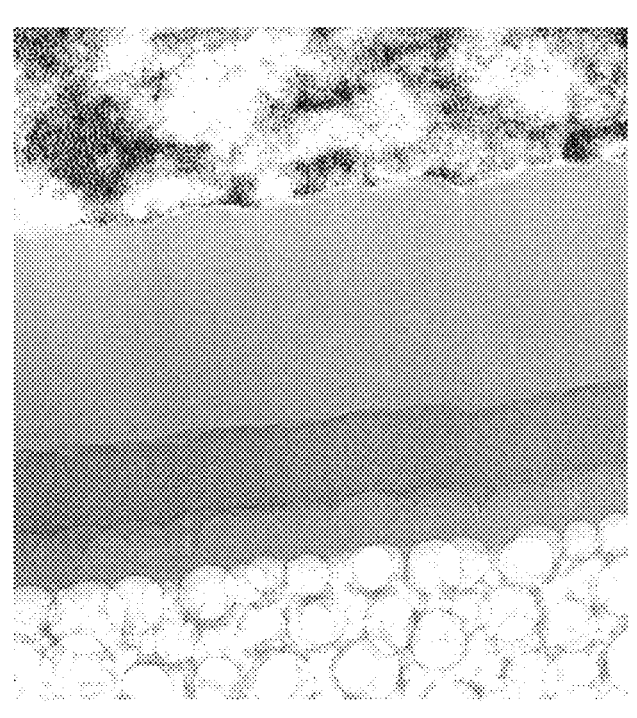
FIG. 12C is a microscopic captured image of a light control member according to an embodiment.

FIG. 12A is a transmission electron microscopic captured image of Comparative Example F1, and FIG. 12B is a transmission electron microscopic captured image of Comparative Example F2. FIG. 12C is a transmission electron microscopic captured image of Example G1, and FIG. 12D is a transmission electron microscopic captured image of Comparative Example F3.

Referring to FIG. 12A and FIG. 12B, in Comparative Examples F1 and F2, the thickness of a barrier layer is less than about 1,000 Å, and it can be seen that there are seams generated in a sub-capping layer disposed on the barrier layer. It may be determined that the barrier layer disposed on a low refractive layer including voids is thin, and thus, seams are generated in the sub-capping layer disposed on the barrier layer.

Figure 12D:
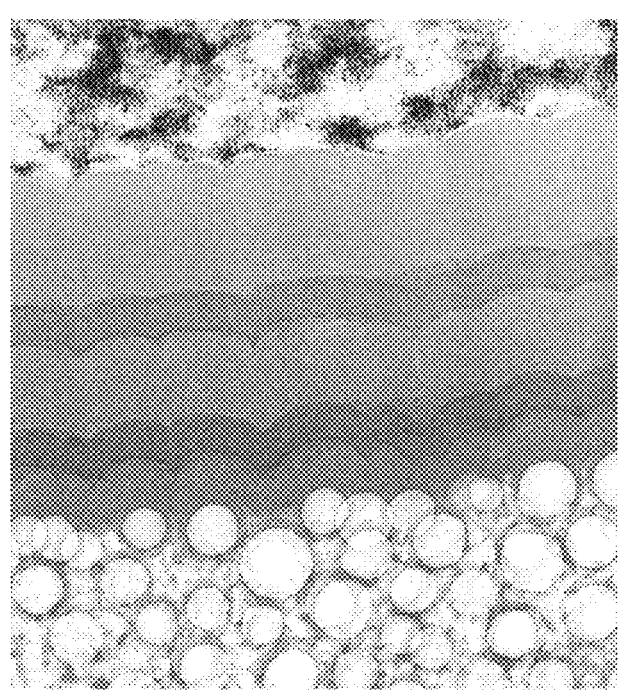
FIG. 12D is a microscopic captured image of a light control member according to a comparative example.

Referring to FIG. 12C and FIG. 12D, it can be seen that there may be hardly any seams generated in Example G1 and Comparative Example F3. It may be determined that Example G1 and Comparative Example F3 may include a barrier layer having a thickness of about 1,000 Å or greater, and thus, have no seams generated.

Table 8 to Table 10 show, in a light control member including a capping layer, a barrier layer, and a sub-capping layer, the evaluation of efficiency, reflectance, luminance ratio, and white angle dependence (WAD) according to a viewing angle. In Table 8 to Table 10, the efficiency represents the efficiency of each of red light, green light, blue light, and white light, and the reflectance represents the

TABLE 7

| Classifications | Thickness of capping layer (Å) | Thickness of barrier layer (Å) | Thickness of sub-capping layer (Å) | Efficiency (%) | Reflectance | WAD (luminance ratio/color difference) |
|---|---|---|---|---|---|---|
| Ref. | 4000 | — | — | 100 | 1.01 | 81.9%/0.013 |
| Comparative Example F1 | 500 | 250 | 3250 | 98 | 1.04 | 82.2%/0.014 |
| Comparative Example F2 | 500 | 500 | 3000 | 97 | 1.05 | 82.9%/0.014 |
| Example G1 | 500 | 1000 | 2500 | 101 | 1.05 | 82.2%/0.013 |
| Comparative Example F3 | 500 | 500 | 1000, 1500 | 95 | 1.14 | 83.8%/0.016 |

Referring to Table 7, it can be seen that, compared to Comparative Examples F1 to F3, Example G1 exhibits excellent efficiency. It can be seen that Example G1 exhibits a good level of reflectance, luminance ratio, and color difference.

reflectance of each of SCI, SCE, and SC. The luminance ratio represents the luminance ratio of each of red light, green light, blue light, and white light, and may be evaluated at a position having a viewing angle of 60 degrees left and right from the front. In Table 8 to Table 10, the efficiency may be represented by a value relative to an efficiency in a light control member which does not include a barrier layer and a sub-capping layer but may include a capping layer, wherein the efficiency may be set to 1000. Table 8 to Table 10 are simulation results.

In Examples H1 to H5 of Table 8, the refractive index of a barrier layer may be about 1.65. In Examples H1 to H5 of Table 8, the total thickness of a capping layer, a barrier layer, and a sub-capping layer may be about 4,000 Å.

TABLE 8

| | Thickness (Å) | | | Efficiency | | | | |
|---|---|---|---|---|---|---|---|---|
| Classifications | Capping layer | Barrier layer | Sub-capping layer | Red (R) | Green (G) | Blue (B) | White (W) | — |
| Ref. | 4000 | — | — | 100.0% | 100.0% | 100.0% | 100.0% | |
| Example H1 | 500 | 1000 | 2500 | 102.9% | 101.3% | 101.2% | 102.0% | |
| Example H2 | 500 | 1500 | 2000 | 103.2% | 101.4% | 99.6% | 101.2% | |
| Example H3 | 500 | 2000 | 1500 | 99.6% | 98.9% | 99.6% | 99.6% | |
| Example H4 | 500 | 2500 | 1000 | 99.1% | 100.9% | 101.8% | 100.5% | |
| Example H5 | 500 | 3000 | 500 | 103.2% | 101.4% | 99.6% | 101.2% | |

| | | | | Luminance ratio | | | | |
|---|---|---|---|---|---|---|---|---|
| | Reflectance | | | Red | Green | Blue | White | WAD |
| Classifications | SCI | SCE | SC | (R) | (G) | (B) | (W) | $\Delta u'v'$ |
| Ref. | 1.11% | 0.59% | 0.52% | 88.0% | 80.0% | 69.2% | 80.7% | 0.0083 |
| Example H1 | 1.10% | 0.59% | 0.51% | 83.1% | 79.7% | 68.5% | 79.5% | 0.0061 |
| Example H2 | 1.09% | 0.60% | 0.49% | 83.8% | 79.4% | 69.8% | 79.5% | 0.0047 |
| Example H3 | 1.12% | 0.58% | 0.54% | 88.6% | 80.7% | 68.6% | 81.3% | 0.0101 |
| Example H4 | 1.11% | 0.58% | 0.53% | 88.4% | 78.7% | 67.7% | 79.8% | 0.0106 |
| Example H5 | 1.09% | 0.60% | 0.49% | 83.4% | 78.1% | 70.5% | 78.6% | 0.0053 |

Referring to Table 8, it can be seen that Examples H1, H2, H4, and H5 exhibit excellent efficiency, and Example H3 exhibits a good level of efficiency. It can be seen that Examples H1 to H5 have a good level of reflectance, luminance ratio, and white angle dependence (WAD) according to the viewing angle.

Examples H1 to 115 are each a light control member of an embodiment which may include a capping layer, a barrier layer, and a sub-capping layer, wherein the thickness of each of the capping layer, the barrier layer, and the sub-capping layer satisfies the above-described thickness range. Examples H1 to H5 each may include a barrier layer which satisfies the refractive index range according to an embodiment. Accordingly, the light control member of an embodiment and a display device including the light control member may exhibit properties of having excellent efficiency and reflectance, and also, the light control member of an embodiment and the display device including the light control member may exhibit properties of having excellent display quality.

In Examples H1 to H15 of Table 9, the refractive index of a barrier layer may be about 1.75. In Examples H11 to H15 of Table 9, the total thickness of a capping layer, a barrier layer, and a sub-capping layer may be about 4,000 Å.

TABLE 9

| | Thickness (Å) | | | Efficiency | | | | |
|---|---|---|---|---|---|---|---|---|
| Classifications | Capping layer | Barrier layer | Sub-capping layer | Red (R) | Green (G) | Blue (B) | White (W) | — |
| Ref. | 4000 | — | — | 100.0% | 100.0% | 100.0% | 100.0% | |
| Example H11 | 500 | 1000 | 2500 | 104.1% | 102.2% | 101.8% | 102.9% | |
| Example H12 | 500 | 1500 | 2000 | 103.8% | 101.2% | 98.7% | 101.0% | |

TABLE 9-continued

| | | | | | | | |
|---|---|---|---|---|---|---|---|
| Example H13 | 500 | 2000 | 1500 | 99.0% | 98.5% | 100.3% | 99.6% |
| Example H14 | 500 | 2500 | 1000 | 99.7% | 102.9% | 102.3% | 101.3% |
| Example H15 | 500 | 3000 | 500 | 104.8% | 103.3% | 98.0% | 101.9% |

| | Reflectance | | | Luminance ratio | | | | |
| | | | | Red | Green | Blue | White | WAD |
| Classifications | SCI | SCE | SC | (R) | (G) | (B) | (W) | $\Delta u'v'$ |
|---|---|---|---|---|---|---|---|---|
| Ref. | 1.11% | 0.59% | 0.52% | 88.0% | 80.0% | 69.2% | 80.7% | 0.0083 |
| Example H11 | 1.10% | 0.59% | 0.51% | 80.5% | 78.6% | 68.2% | 78.2% | 0.0045 |
| Example H12 | 1.09% | 0.60% | 0.49% | 82.7% | 79.4% | 70.2% | 79.3% | 0.0034 |
| Example H13 | 1.13% | 0.57% | 0.57% | 88.9% | 81.0% | 67.5% | 81.5% | 0.0114 |
| Example H14 | 1.10% | 0.58% | 0.53% | 86.0% | 77.4% | 67.6% | 78.3% | 0.0094 |
| Example H15 | 1.09% | 0.60% | 0.49% | 79.1% | 77.8% | 71.7% | 77.5% | 0.0032 |

Referring to Table 9, it can be seen that Examples H1, H2, H4, and H5 exhibit excellent efficiency, and Example H3 exhibits a good level of efficiency. It can be seen that Examples H1 to H5 have a good level of reflectance, luminance ratio, and white angle dependence (WAD) according to the viewing angle.

Examples H1 to H5 are each a light control member of an embodiment which may include a capping layer, a barrier layer, and a sub-capping layer, wherein the thickness of each of the capping layer, the barrier layer, and the sub-capping layer satisfies the above-described thickness range. Examples H1 to H5 each may include a barrier layer which satisfies the refractive index range according to an embodiment. Accordingly, the light control member of an embodiment and a display device including the light control member may exhibit properties of having excellent efficiency and reflectance, and also, the light control member of an embodiment and the display device including the light control member may exhibit properties of having excellent display quality.

In Examples H21 to H25 of Table 10, the refractive index of a barrier layer may be about 1.85. In Examples H21 to H25 of Table 10, the total thickness of a capping layer, a barrier layer, and a sub-capping layer may be about 4,000 Å.

Referring to Table 10, it can be seen that Examples H21, H22, H24, and H25 exhibit excellent efficiency, and Example H23 exhibits a good level of efficiency. It can be seen that Examples H21 to H25 have a good level of reflectance, luminance ratio, and white angle dependence (WAD) according to the viewing angle.

Examples H21 to H25 are each a light control member of an embodiment which may include a capping layer, a barrier layer, and a sub-capping layer, wherein the thickness of each of the capping layer, the barrier layer, and the sub-capping layer satisfies the above-described thickness range. Examples H21 to H25 each may include a barrier layer which satisfies the refractive index range according to an embodiment. Accordingly, the light control member of an embodiment and a display device including the light control member may exhibit properties of having excellent efficiency and reflectance, and also, the light control member of an embodiment and the display device including the light control member may exhibit properties of having excellent display quality.

A display device of an embodiment may include a display element layer and a light control member of an embodiment disposed on the display element layer. The light control member of an embodiment may include a light control layer including quantum dots, a low refractive layer disposed on

TABLE 10

| | Thickness (Å) | | | Efficiency | | | | |
| | Capping layer | Barrier layer | Sub-capping layer | Red (R) | Green (G) | Blue (B) | White (W) | — |
| Classifications | | | | | | | | |
|---|---|---|---|---|---|---|---|---|
| Ref. | 400 | — | — | 100.0% | 100.0% | 100.0% | 100.0% | |
| Example H21 | 50 | 100 | 250 | 104.7% | 102.6% | 102.1% | 103.3% | |
| Example H22 | 50 | 150 | 200 | 103.8% | 100.5% | 97.5% | 100.5% | |
| Example H23 | 50 | 200 | 150 | 98.4% | 98.4% | 100.3% | 99.4% | |
| Example H24 | 50 | 250 | 100 | 101.4% | 105.3% | 101.1% | 101.9% | |
| Example H25 | 50 | 300 | 50 | 107.0% | 101.4% | 96.5% | 102.1% | |

| | Reflectance | | | Luminance ratio | | | | |
| | | | | Red | Green | Blue | White | WAD |
| Classifications | SCI | SCE | SC | (R) | (G) | (B) | (W) | $\Delta u'v'$ |
|---|---|---|---|---|---|---|---|---|
| Ref. | 1.11% | 0.59% | 0.52% | 88.0% | 80.0% | 69.2% | 80.7% | 0.0083 |
| Example H21 | 1.10% | 0.58% | 0.52% | 78.8% | 78.2% | 67.9% | 77.5% | 0.0031 |
| Example H22 | 1.10% | 0.59% | 0.51% | 82.7% | 79.7% | 71.3% | 79.6% | 0.0027 |
| Example H23 | 1.15% | 0.55% | 0.60% | 89.4% | 80.8% | 67.5% | 81.5% | 0.0120 |
| Example H24 | 1.10% | 0.58% | 0.52% | 81.2% | 75.3% | 69.0% | 76.0% | 0.0083 |
| Example H25 | 1.11% | 0.59% | 0.52% | 75.5% | 80.3% | 71.3% | 78.6% | 0.0047 | the light control layer, and a capping layer disposed between the light control layer and the low refractive layer. The capping layer may include a first silicon oxynitride containing an amount of nitrogen in a range of about 0.1 at % to about 18 at %, an amount of oxygen in a range of about 42 at % to about 70 at %, and an amount of silicon in a range of about 25 at % to about 45 at %. The first silicon oxynitride included in the capping layer according to an embodiment may have a ratio of oxygen atoms to silicon atoms in a range of about 1.0 to about 2.0. The capping layer including the first silicon oxynitride according to an embodiment and the light control member including the capping layer may have improved film durability, and may exhibit properties of having excellent efficiency and reflectance. The light control member of an embodiment and the display device including the light control member may exhibit improved display quality and excellent reliability.

A light control member of an embodiment may include a capping layer containing silicon oxynitride in which each of the atomic ratio of nitrogen, oxygen, and silicon atoms may be controlled, and thus, may exhibit properties of having improved reliability.

A display device of an embodiment may include the light control member of an embodiment disposed on a display element layer, and thus, may exhibit excellent reliability.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light control member comprising:
a light control layer including a quantum dot;
a low refractive layer disposed on the light control layer; and
a capping layer disposed between the light control layer and the low refractive layer, wherein
the capping layer includes a first silicon oxynitride containing:
    an amount of nitrogen in a range of about 0.1 at % to about 18 at %;
    an amount of oxygen in a range of about 42 at % to about 70 at %; and
    an amount of silicon in a range of about 25 at % to about 45 at %.

2. The light control member of claim 1, wherein a refractive index of the capping layer is in a range of about 1.35 to about 1.60.

3. The light control member of claim 1, wherein a refractive index of the capping layer is greater than a refractive index of the low refractive layer and equal to or less than a refractive index of the light control layer.

4. The light control member of claim 1, wherein the capping layer has a ratio of oxygen atoms to silicon atoms in a range of about 1.0 to about 2.0.

5. The light control member of claim 1, wherein a thickness of the capping layer is in a range of about 3,000 Å to less than about 8,000 Å.

6. The light control member of claim 1, further comprising:
a barrier layer disposed between the capping layer and the light control layer or between the capping layer and the low refractive layer; and
a sub-capping layer disposed between the barrier layer and the light control layer or between the barrier layer and the low refractive layer, wherein
a refractive index of the barrier layer is greater than a refractive index of the capping layer and a refractive index of the sub-capping layer.

7. The light control member of claim 6, wherein
the barrier layer comprises silicon nitride or a second silicon oxynitride, and
the second silicon oxynitride has a higher ratio of nitrogen atoms than a ratio of oxygen atoms.

8. The light control member of claim 6, wherein the sub-capping layer comprises silicon oxide or the first silicon oxynitride.

9. The light control member of claim 6, wherein the sub-capping layer has a ratio of oxygen atoms to silicon atoms in a range of about 1.0 to about 2.0.

10. The light control member of claim 6, wherein a thickness of the barrier layer is in a range of about 25% to about 74% of a total thickness of the capping layer, the barrier layer, and the sub-capping layer.

11. The light control member of claim 6, wherein a thickness of the barrier layer is in a range of about 1,000 Å to about 5,920 Å.

12. The light control member of claim 6, wherein a refractive index of the barrier layer is in a range of about 1.59 to about 1.89.

13. The light control member of claim 6, wherein a refractive index of the capping layer and the sub-capping layer is each independently in a range of about 1.41 to about 1.49.

14. The light control member of claim 6, wherein,
a thickness of one of the capping layer and the sub-capping layer is in a range of about 13% to about 38% of a total thickness of the capping layer, the barrier layer, and the sub-capping layer, and
a thickness of the other of the capping layer and the sub-capping layer is in a range of about 13% to about 62% of a total thickness of the capping layer, the barrier layer, and the sub-capping layer.

15. The light control member of claim 6, wherein
a thickness of one of the capping layer and the sub-capping layer is in a range of about 500 Å to about 3,040 Å, and
a thickness of the other of the capping layer and the sub-capping layer is in a range of about 500 Å to about 4,960 Å.

16. A display device comprising:
a lower panel including a display element layer which includes:
a first electrode;
a second electrode facing the first electrode; and
a light emission layer disposed between the first electrode and the second electrode; and
an upper panel disposed on the lower panel and including:
a light control member; and
a color filter layer disposed on the light control member, wherein
the light control member includes:
a light control layer including a quantum dot;
a low refractive layer disposed on the light control layer; and a capping layer disposed between the low refractive layer and the light control layer, and the capping layer includes a first silicon oxynitride containing:

an amount of nitrogen in a range of about 0.1 at % to about 18 at %;

an amount of oxygen in a range of about 42 at % to about 70 at %; and an amount of silicon in a range of about 25 at % to about 45 at %.

17. The display device of claim 16, wherein the capping layer has a ratio of oxygen atoms to silicon atoms in a range of about 1.0 to about 2.0.

18. The display device of claim 16, wherein a refractive index of the capping layer is in a range of about 1.35 to about 1.60.

19. The display device of claim 16, further comprising:

a barrier layer disposed between the capping layer and the light control layer or between the capping layer and the low refractive layer; and a sub-capping layer disposed between the barrier layer and the light control layer or between the barrier layer and the low refractive layer, wherein the barrier layer comprises silicon nitride or a second silicon oxynitride, and the second silicon oxynitride has a higher ratio of nitrogen atoms than a ratio of oxygen atoms.

20. The display device of claim 19, wherein the sub-capping layer comprises silicon oxide or the first silicon oxynitride.

21. The display device of claim 19, wherein a refractive index of the barrier layer is greater than a refractive index of the capping layer and greater than a refractive index of the sub-capping layer.

22. The display device of claim 19, wherein a refractive index of the barrier layer is in a range of about 1.59 to about 1.89, and a refractive index of the capping layer and the sub-capping layer is each independently in a range of about 1.41 to about 1.49.

23. The display device of claim 16, wherein the low refractive layer and the light control layer each contact the capping layer.

24. The display device of claim 16, wherein the low refractive layer comprises a plurality of hollow particles, and each of the hollow particles includes a hollow portion filled with air or filled with liquid.

25. The display device of claim 16, wherein the light emission layer emits a first light, and the light control layer comprises:

a first light control part converting the first light into a second light;

a second light control part converting the first light into a third light; and a third light control part transmitting the first light.

26. A display device comprising:

a lower panel including a display element layer which includes:

a first electrode;

a second electrode facing the first electrode; and a light emission layer disposed between the first electrode and the second electrode; and an upper panel disposed on the lower panel and including:

a light control layer which includes a quantum dot;

a low refractive layer disposed on the light control layer; and a capping layer disposed between the light control layer and the low refractive layer, wherein the capping layer includes silicon oxynitride having a ratio of oxygen atoms to silicon atoms in a range of about 1.0 to about 2.0, and the ratio of the oxygen atoms is higher than the ratio of nitrogen atoms.

27. The display device of claim 26, wherein the capping layer comprises:

an amount of nitrogen in a range of about 0.1 at % to about 18 at %;

an amount of oxygen in a range of about 42 at % to about 70 at %; and an amount of silicon in a range of about 25 at % to about 45 at %.

28. The display device of claim 26, wherein a refractive index of the capping layer is in a range of about 1.35 to about 1.60.

29. A media device comprises a display device, the display device comprising:

a lower panel including a display element layer which includes:

a first electrode;

a second electrode facing the first electrode; and a light emission layer disposed between the first electrode and the second electrode; and an upper panel disposed on the lower panel and including:

a light control member; and a color filter layer disposed on the light control member, wherein the light control member includes:

a light control layer including a quantum dot;

a low refractive layer disposed on the light control layer; and a capping layer disposed between the low refractive layer and the light control layer, and the capping layer includes a first silicon oxynitride containing:

an amount of nitrogen in a range of about 0.1 at % to about 18 at %;

an amount of oxygen in a range of about 42 at % to about 70 at %; and an amount of silicon in a range of about 25 at % to about 45 at %.

30. The media device of claim 29, wherein the media device is a television, an external billboard, a portable electronic apparatus, a tablet computer, a car navigation system unit, a game console, a personal computer, a laptop computer, or a wearable device.

\* \* \* \* \*